(12) United States Patent
Kim et al.

(10) Patent No.: US 11,832,488 B2
(45) Date of Patent: Nov. 28, 2023

(54) DISPLAY DEVICE HAVING AUXILIARY WIRING

(71) Applicant: LG Display Co., Ltd., Seoul (KR)

(72) Inventors: Yong Il Kim, Dangjin-si (KR); Young Wook Lee, Paju-si (KR); Na Ra Shin, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 209 days.

(21) Appl. No.: 17/367,312

(22) Filed: Jul. 2, 2021

(65) Prior Publication Data

US 2022/0093721 A1    Mar. 24, 2022

(30) Foreign Application Priority Data

Sep. 18, 2020   (KR) .................. 10-2020-0120896

(51) Int. Cl.
| | |
|---|---|
| *H10K 59/131* | (2023.01) |
| *H10K 59/122* | (2023.01) |
| *H10K 59/124* | (2023.01) |
| *H10K 71/00* | (2023.01) |
| H10K 50/818 | (2023.01) |
| H10K 59/126 | (2023.01) |
| H10K 59/12 | (2023.01) |
| H10K 102/00 | (2023.01) |

(52) U.S. Cl.
CPC ....... *H10K 59/1315* (2023.02); *H10K 59/122* (2023.02); *H10K 59/124* (2023.02); *H10K 71/00* (2023.02); *H10K 50/818* (2023.02); *H10K 59/1201* (2023.02); *H10K 59/126* (2023.02); *H10K 2102/3026* (2023.02)

(58) Field of Classification Search
CPC ............. H10K 59/1315; H10K 59/122; H10K 59/124; H10K 59/126; H10K 2102/3026; H10K 50/818
USPC .......................................................... 257/40
See application file for complete search history.

(56) References Cited

U.S. PATENT DOCUMENTS

| | | | | |
|---|---|---|---|---|
| 2004/0075092 | A1* | 4/2004 | Arao .................. | H01L 29/78675 257/E29.151 |
| 2010/0244664 | A1* | 9/2010 | Fujioka ................ | H10K 50/824 445/24 |
| 2014/0353607 | A1* | 12/2014 | Kim ..................... | H10K 59/123 438/34 |
| 2016/0043341 | A1* | 2/2016 | Heo ..................... | H10K 59/122 438/23 |
| 2016/0233282 | A1* | 8/2016 | Song ..................... | H10K 71/00 |

FOREIGN PATENT DOCUMENTS

| | | |
|---|---|---|
| KR | 10-0768715 B | 10/2007 |
| KR | 10-2018-0046229 A | 5/2018 |

* cited by examiner

*Primary Examiner* — Xia L Cross
(74) *Attorney, Agent, or Firm* — POLSINELLI PC

(57) ABSTRACT

A display device includes a multilayer passivation structure and has an undercut formed in the passivation structure such that a connection between a cathode and an auxiliary wiring is formed inside the undercut, so as to prevent voltage drop of the cathode and influence of hydrogen on thin film transistors and thus to improve reliability of the display device.

19 Claims, 15 Drawing Sheets

DISPLAY DEVICE HAVING AUXILIARY WIRING

CROSS-REFERENCE TO RELATED APPLICATION

This application claims the benefit of Korean Patent Application No. 10-2020-0120896, filed on Sep. 18, 2020, which is hereby incorporated by reference in its entirety as if fully set forth herein.

BACKGROUND

Field of the Disclosure

The present disclosure relates to a display device, and more particularly, to a display device which uses a reflective electrode as an anode so as to exhibit high reflectance, secures connection between an auxiliary wiring and a cathode in a passivation structure, and prevents hydrogen from penetrating into thin film transistors

Description of the Background

As society has recently entered the information age, the field of displays for visually displaying electrical information signals has rapidly developed and, in order to satisfy such development, various display devices having excellent performance, such as slimness, light weight and low power consumption, have been developed and have rapidly replaced conventional cathode ray tubes (CRTs).

Among self-light emitting display devices, which do not require separate light sources, achieve compactness and clear color display and include light emitting devices within a display panel, are considered as competitive applications.

In light emitting devices provided in respective subpixels of a display device, because one electrode is integrally provided throughout the entirety of an active area of the display device, the electrode integrally provided throughout the subpixels is formed to have a large size. In such a large-sized electrode, auxiliary connection parts, configured to prevent voltage drop in a region far away from a region to which voltage is applied, are required.

SUMMARY

Accordingly, the present disclosure is directed to a display device, which includes auxiliary connection parts in a passivation structure so as to prevent voltage drop of a cathode and penetration of hydrogen, that substantially obviates one or more problems due to limitations and disadvantages of the related art.

The present disclosure is to provide a display device which includes an undercut provided in a multilayer passivation structure, and forms a connection between a cathode and an auxiliary wiring at the undercut in the passivation structure, so as to prevent voltage drop of the cathode and to improve reliability. Here, the passivation structure includes a plurality of layers formed of inorganic insulating films including different components, and may thus prevent hydrogen generated from an encapsulation film formed thereon through a low-temperature process from penetrating into elements provided under the passivation structure.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display device includes auxiliary wirings on a substrate, a passivation structure formed by stacking a first layer and a second layer on the auxiliary wirings and configured such that an open region of the first layer is greater in size than an open region of the second layer with respect to each of the auxiliary wirings, a bank provided on the passivation structure and configured to have first holes corresponding to the auxiliary wirings and having a greater size than the open region of the first layer, and second holes corresponding to the emission parts, and light emitting devices respectively provided in the emission parts, each of the light emitting devices including a first electrode including a reflective metal layer, an organic layer including at least one emission layer, and a second electrode, wherein the second electrode extends towards the auxiliary wiring inside each of the second holes of the bank and is directly connected to the auxiliary wiring in the open region of the first layer under the second layer.

In another aspect of the present disclosure, a display device includes a substrate having emission parts, transmission parts and auxiliary connection parts, auxiliary wirings provided in the auxiliary connection parts of the substrate, a passivation structure formed by stacking a first layer and a second layer on the auxiliary wirings and configured such that an open region of the first layer is greater in size than an open region of the second layer with respect to each of the auxiliary wirings, a bank provided on the passivation structure and configured to have first holes corresponding to the auxiliary wirings and having a greater size than the open region of the first layer, second holes corresponding to the emission parts, and third holes corresponding to the transmission parts, and light emitting devices respectively provided in the emission parts, each of the light emitting devices including a first electrode including a reflective metal layer, an organic layer including at least one emission layer, and a second electrode, wherein the second electrode extends towards the auxiliary wiring in the open region of the first layer under the second layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
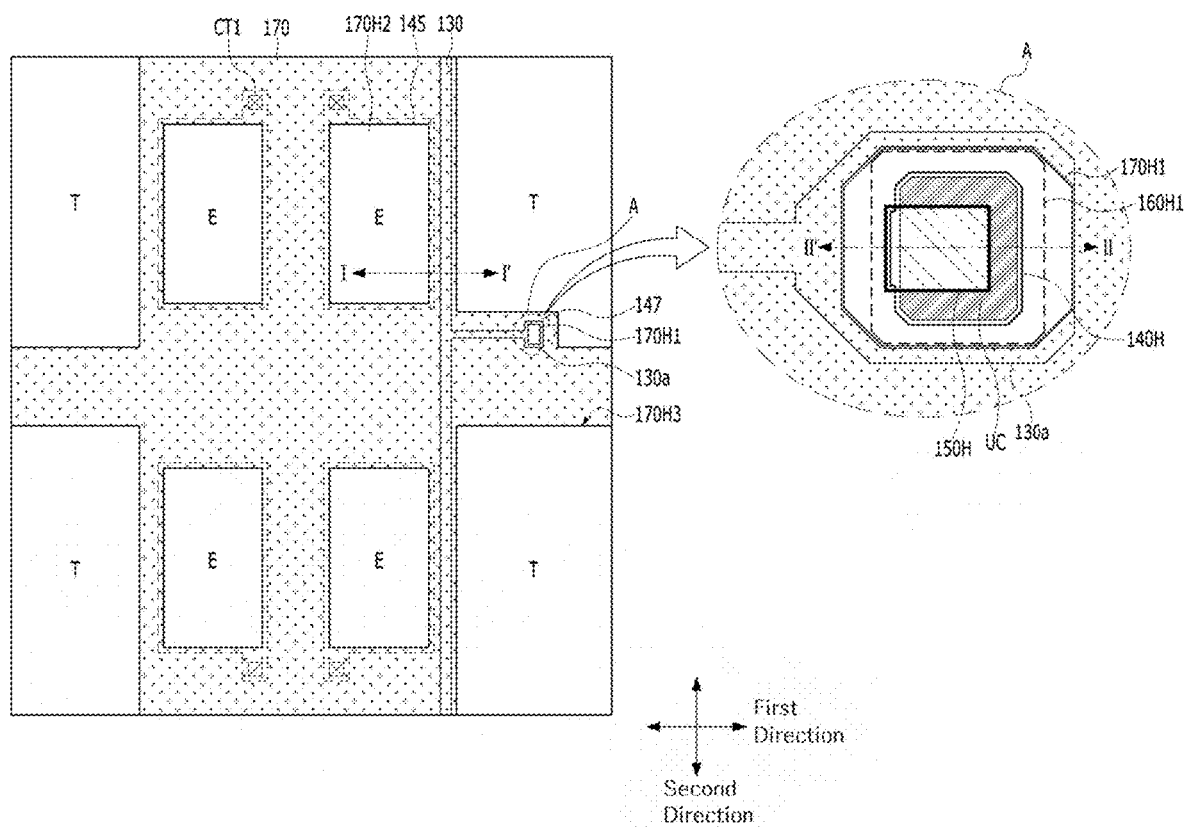
FIG. 1 is a plan view illustrating a display device according to one aspect of the present disclosure.

Reference will now be made in detail to the exemplary aspects of the present disclosure, examples of which are illustrated in the accompanying drawings. In the following description of the aspects and the drawings, the same or similar elements are denoted by the same reference numerals throughout the specification. In the following description of the aspects of the present disclosure, a detailed description of known functions and configurations incorporated herein will be omitted when it can make the subject matter of the present disclosure rather unclear. Further, the names of elements used in the following description of the aspects of the present disclosure are selected in consideration of ease of preparation of the specification, and can thus differ from the names of parts of an actual product.

The shapes, sizes, ratios, angles and numbers of elements given in the drawings to describe the aspects of the present disclosure are merely exemplary, and thus, the present disclosure is not limited to the illustrated details. In the following description of the aspects, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In the interpretation of elements included in the various aspects of the present disclosure, it is to be interpreted that the elements include error ranges unless stated otherwise.

In the following description of the aspects, it will be understood that, when positional relationships are expressed, for example, when an element is said to be "on", "above", "under" or "beside" another element, the two elements can directly contact each other, or one or more other elements can be interposed between the two elements, unless the term "just" or "directly" is used.

In the following description of the aspects, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the aspects, it will be understood that, when the terms "first", "second", etc. are used to describe various elements, these terms are used merely to distinguish the same or similar elements. Therefore, a first element described hereinafter could be termed a second element without departing from the technical scope of the disclosure.

Respective features of the various aspects of the present disclosure can be partially or wholly coupled to or combined with each other and be interlocked or driven in various technical manners, and the respective aspects can be implemented independently of each other or be implemented together through connection therebetween.

Hereinafter, a display device according to the present disclosure will be described with reference to the accompanying drawings.

FIG. 1 is a plan view illustrating a display device according to one aspect of the present disclosure. Further, FIG. 2 is a longitudinal-sectional view taken along line I-I' of FIG. 1, and FIG. 3 is a longitudinal-sectional view of region A of FIG. 1, taken along line II-II' of FIG. 1.

Figure 2:
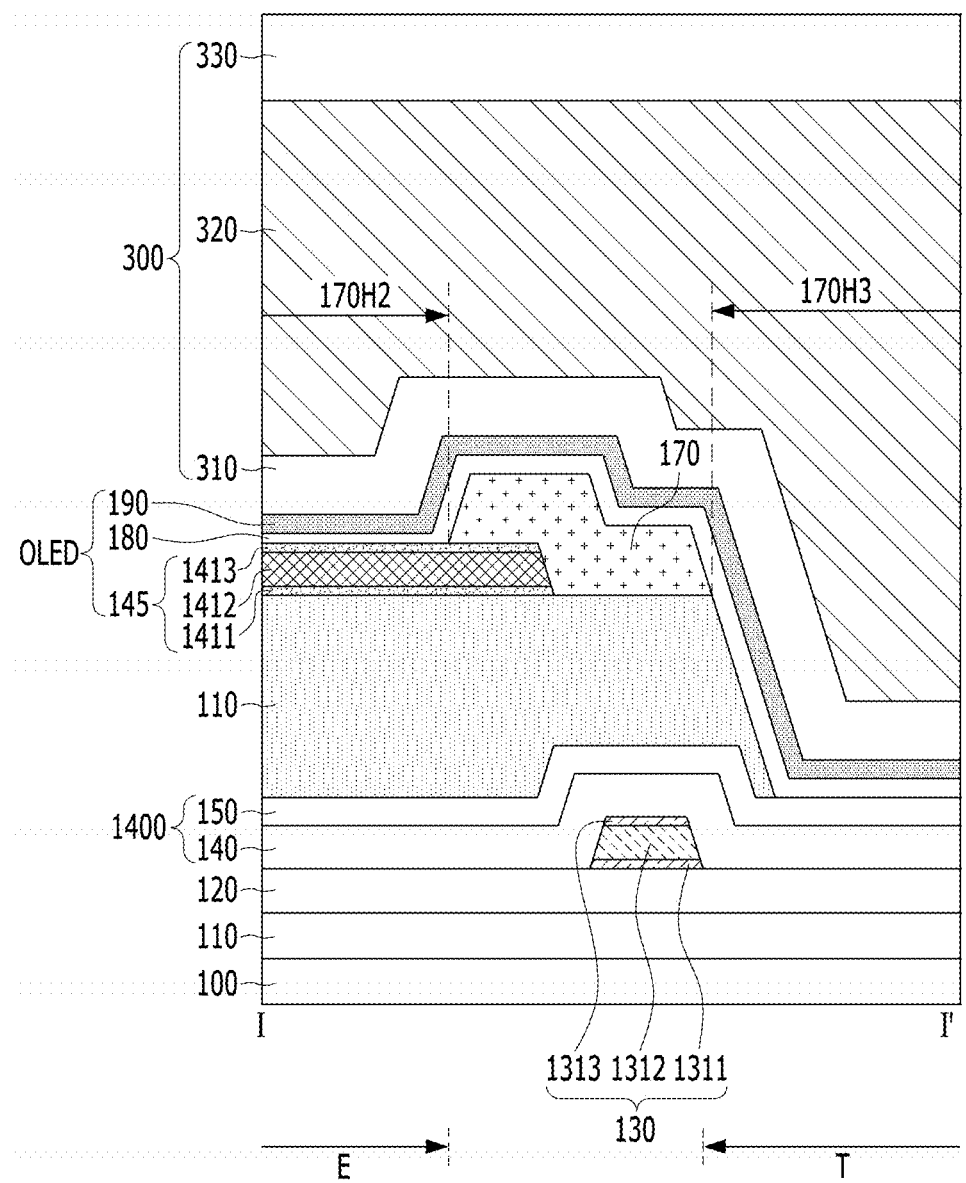
FIG. 2 is a longitudinal-sectional view taken along line I-I' of FIG. 1.
Figure 3:
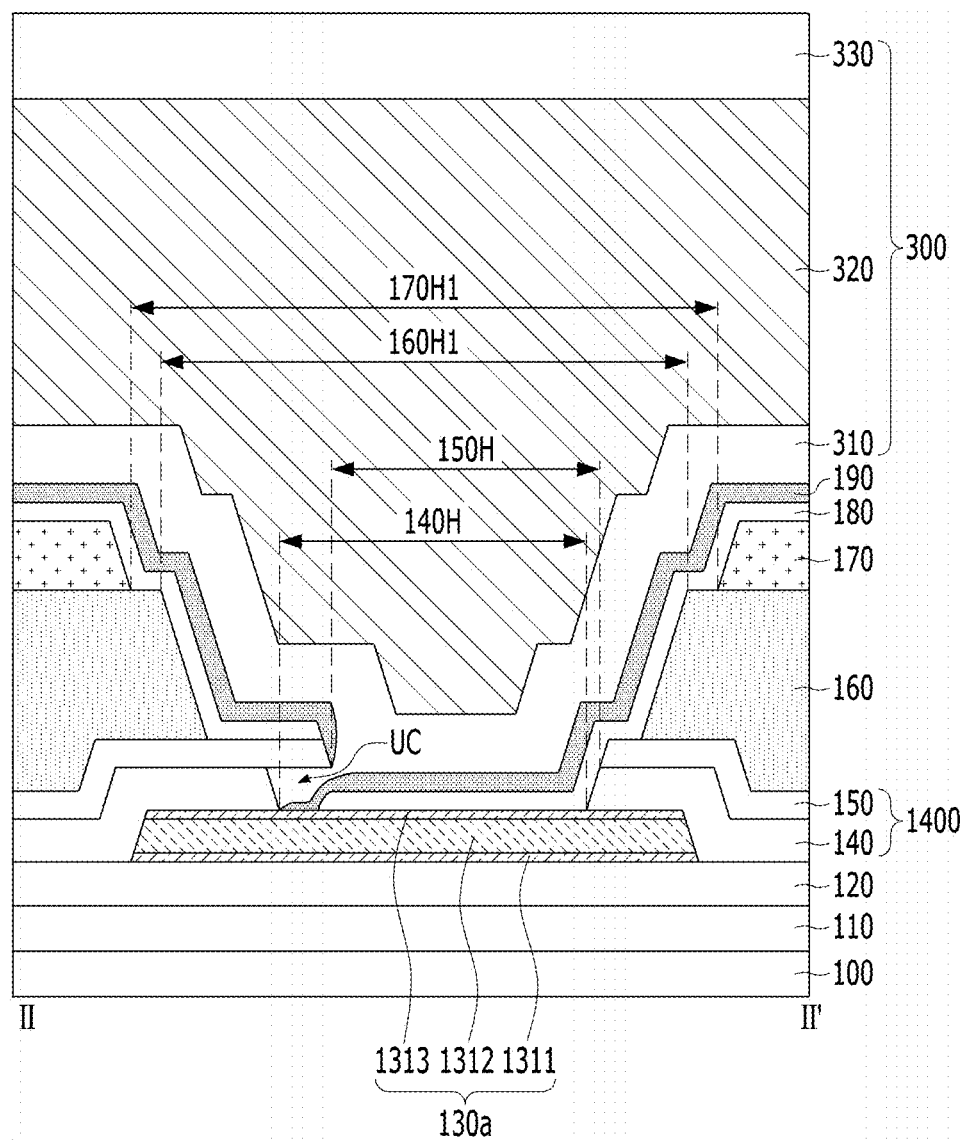
FIG. 3 is a longitudinal-sectional view of region A of FIG. 1, taken along line II-II' of FIG. 1.

As shown in FIGS. 1 to 3, the display device according to one aspect of the present disclosure includes auxiliary wirings 130 on a substrate 100, a passivation structure 1400 formed by stacking a first layer 140 and a second layer 150 on the auxiliary wirings 130 and having an undercut UC with respect to each of extensions 130a of the auxiliary wirings 130, a bank 170 configured to have first holes 170H1 greater in size than an open region 140H of the first layer 140 of the passivation structure 1400 including the undercut UC, and light emitting devices OLED respectively provided in emission parts E.

In the display device according to the present disclosure, the light emitting device OLED includes a first electrode 145 including a reflective metal layer 1412, an organic layer 180 including at least one emission layer, and a second electrode 190. The second electrode 190 is a transparent electrode so that emitted light passes through the second electrode 190.

The extension 130a of the auxiliary wiring 130 is integrated with the auxiliary wiring 130 such that ground voltage or VSS voltage having a regular voltage value applied to the auxiliary wiring 130 is also applied to the extension 130a, and is conductively connected to the second electrode 190 so as to transmit the voltage to the second electrode 190. The extension 130a of the auxiliary wiring 130 is patterned in a specific region and is thus referred to as an auxiliary electrode, or receives the same VSS voltage as the auxiliary wiring 130 and is thus considered as being equivalent to the auxiliary wiring 130. In some cases, an auxiliary connection part connected to the second connection 190 may be directly formed on the auxiliary wiring 130 without the extension 130a of the auxiliary wiring 130.

In the display device according to the present disclosure, a region in which the extension 130a of the auxiliary wiring 130 and the second electrode 190 are connected to each other is disposed every one or more pixels. Through connection between the extension 130a of the auxiliary wiring 130 and the second electrode 190, even though the second electrode 190 is integrally formed throughout a large area in the active area AA, VSS voltage is uniformly applied to the second electrode 190 without deviations among regions. In this case, one pixel may include a plurality of emission parts E and one transmission part T or a plurality of transmission parts T. The auxiliary wiring 130 may be disposed in a first direction in each region including a plurality of emission parts E and at least one transmission part T, and the extension 130a of the auxiliary wiring 130 may be disposed in a second direction every two or more emission parts E or every one or more transmission parts T.

FIG. 1 illustrates that the extension 130a of the auxiliary wiring 130 is disposed between the transmission parts T and is connected to the second electrode 190. However, the disclosure is not limited thereto, and the extension 130a of the auxiliary wiring 130 may be disposed between the emission part E and the transmission part T and, in some cases, may be disposed between the emission parts E. The extensions 130a are desirably provided in regions adjacent to the auxiliary wirings 130 on the grounds of reducing line resistance. FIG. 1 illustrates a structure in which the extension 130a of the auxiliary wiring 130 is provided adjacent to one transmission part T and, in order to prevent influence on the emission parts E due to disconnection of the organic layer 180 at the undercut UC in the passivation structure 1400 on the extension 130a of the auxiliary wiring 130, the extension 130a is provided so as to be spaced apart from the emission parts E, an auxiliary wiring connection part is provided on the extension 130a of the auxiliary wiring 130.

In the display device according to the present disclosure, the passivation structure 1400, which is provided so as to protect thin film transistors, may not only perform connection between the auxiliary wiring 130 provided under the passivation structure 1400 and the second electrode 190 provided on the passivation structure 1400 through the undercut UC but also prevent hydrogen from penetrating or diffusing into the thin film transistors under the passivation structure 1400, thereby being capable of preventing changes in the characteristics of the thin film transistors. Therefore, the passivation structure 1400 according to the present disclosure includes at least two layers, and covers wirings, such as gate lines and data lines, except for the extension 130a of the auxiliary wiring 130 around the undercut UC, and the thin film transistors.

The passivation structure 1400 includes a stack of the first layer 140 and the second layer 150, and the first open region 140H of the first layer 140 is greater in size than a second open region 150H of the second layer 150 in at least one side thereof with respect to the extension 130a of the auxiliary wiring 130. FIG. 1 illustrates that the first open region 140H has a greater width than the second open region 150H having a rectangular shape at three sides thereof, and the undercut UC is formed at these three sides. However, the disclosure is not limited thereto, and when the second open region 150H has other polygonal shapes than the rectangular shape, the first open region 140H may protrude more than the remaining sides of the second open region 150H except for one side of the second open region 150H. Here, the reason why one side of the second open region 150H is located farther outwards than the first open region 140H is that the undercut is not formed at this region. When the first open region 140H is greater in size than the second open region 150H at all sides thereof, the undercut is formed at all sides of the second open region 150H, and in this case, the second electrode 190 located at the side part of the second layer 150 and the second electrode 190 located on the extension 130a of the auxiliary wiring 130 are separated from each other and thus the signal of the auxiliary wiring 130 is not capable of being applied to the second electrode 190. Therefore, when the second open region 150H has a polygonal shape having n sides, the first open region 140H is set to be greater in size than the second open region 150H at 1 to n−1 sides thereof so that the undercut UC is formed at regions having a size difference between the first and second open regions 140H and 150H, and the first open region 140H is set to be not greater in size than the second open region 150H at the remaining sides thereof. Thereby, the second electrode 190 goes down from the upper part of the second layer 150 along the side parts of the second layer 150 and the first layer 140 and is formed evenly on the extension 130a of the auxiliary wiring 130, as shown in the right region of FIG. 3, and the second electrode 190 extends so as to be closer to the first layer 140 in the undercut region than the organic layer 180, and is thus directly connected to the extension 130a of the auxiliary wiring 130, as shown in the left region of FIG. 3.

In contrast to the example shown in FIG. 1, as another example, when the second open region 150H has a hexagonal shape, the first open region 140H may protrude more than the remaining five sides of the second open region 150H except for one side of the second open region 150H, or the first open region 140H may protrude more than four sides, three sides, two sides, or one side of the second open region 150H. An undercut UC is defined in regions in which the first open region 140H protrudes more than the second open region 150H, and thus, as shown in FIG. 3, the second layer 150 of the passivation structure 1400 is located farther into the first hole 170H of the bank 170 than the first layer 140. Further, the region in which the first layer 140 is removed more than the second layer 150 is defined as the undercut.

In the region in which the first open region 140H of the first layer 140 protrudes more than the second open region 150H of the second layer 150, the protruding width of the first open region 140H may be 0.4 µm to 2.0 µm. When the protruding width of the first open region 140H is smaller than 0.4 µm in the region in which the first open region 140H protrudes, it may be difficult to secure the undercut region sufficient for the second electrode 190 to be connected to the extension 130a of the auxiliary wiring 130, and when the protruding width of the first open region 140H exceeds 2.0 µm in the region in which the first open region 140H protrudes, the second layer 150 may collapse in subsequent processes.

FIG. 1, which is a plan view of the display device according to one aspect of the present disclosure, illustrates a part of the active area AA in which display is realized. A plurality of emission parts E and a plurality of transmission parts T are disposed in the active area AA. Each of the emission parts E emits light with a designated color, and the transmission parts T transmit light from below. The bank 170 is provided so as to expose the emission parts E and the transmission parts T. Further, the bank 170 covers the auxiliary wirings 130 except for the extensions 130a connected to the second electrodes 190. That is, the bank 170 has the first holes 170H1 corresponding to the extensions 130a, second holes 170H2 corresponding to the emission parts E, and third holes 170H3 corresponding to the transmission parts T.

An organic insulating film 160 may be disposed between the bank 170 and the passivation structure 1400, and the organic insulating film 160 may cover steps of the surface of the passivation structure 1400 so as to planarize the surface of the passivation structure 1400. The organic insulating film 160 may be referred to as an overcoat layer or a planarization layer in terms of functions thereof. In some cases, the organic insulating film 160 may be omitted.

The first and second open regions 140H and 150H of the first and second layers 140 and 150 of the passivation structure 1400 are located on the extension 130a of the auxiliary wiring 130. The first and second open regions 140H and 150H of the passivation structure 1400 are located inside a hole 160H of the organic insulating film 160 and the first hole 170H1 of the bank 170, parts of the first and second layers 140 and 150 of the passivation structure 1400 are located inside the hole 160H of the organic insulating film 160 and the first hole 170H1 of the bank 170 and cover a part of the extension 130a of the auxiliary wiring 130, and the undercut is defined such that the first open region 140H of the first layer 140 is greater in size than the second open region 150H of the second layer 150. The first layer 140 has the undercut UC with respect to the second layer 150, and the second electrode 190 is connected to the extension 130a of the auxiliary wiring 130 in the first open region 140H which is greater in size than the second open region 150H.

The passivation structures 1400 may include only inorganic insulating films, and the first layer 140 contacting at least the extension 130a of the auxiliary wiring 130 and the second layer 150 contacting the first layer 140 have different etching properties. Therefore, the first and second open regions of the first and second layers 140 and 150 of the passivation structure 1400 are primarily formed to have the same width or similar widths, and then, the first layer 140 is secondarily further etched compared to the second layer 150 so that the first open region 140H is greater in size than the second region 150H. Here, a part of the first open region 140H of the first layer 140 which is removed more than the second open region 150H of the second layer 150 may be defined as the undercut UC.

In the display device according to the present disclosure, because the part of the first open region 140H of the first layer 140 which is removed more than the second open region 150H of the second layer 150 is defined as the undercut UC, the thickness of the first layer 140 is set to be equal to or greater than the sum of the thickness of the organic layer 180 and the thickness of the second electrode 190, and thus, when the organic layer 180 is deposited, the organic layer 180 accumulated in the open region 150H of the second layer 150 in the undercut region does not close the side part of the undercut UC. That is, the organic layer 180 having straightness is deposited on the extension 130a of the auxiliary wiring 130 exposed outside the undercut UC, and is thus accumulated in the second open region 150H of the second layer 150. When the organic layer 180 is deposited, even though the organic layer 180 is accumulated on the extension 130a of the auxiliary wiring 130 corresponding to a part of the undercut region due to partial shadowing, the thickness of the organic layer 180 in the undercut region is less than the thickness of the organic layer 180 accumulated in the flat part of the second open region 150H. Further, because the organic layer 180 has poor step coverage even in a shaded part, the organic layer 180 may be discontinuous in the undercut region, and a metal material forming the second electrode 190 deposited on the organic layer 180 has excellent step coverage compared to the organic layer 180, enters into the undercut UC while covering the upper and side parts of the organic layer 180, and is directly connected to the extension 130a of the auxiliary wiring 130.

The first layer 140 and the second layer 150 may be different inorganic insulating films, and for example, the first layer 140 may be an oxide film, such as a silicon oxide ($SiO_x$) film or an aluminum oxide ($Al_2O_3$) film, and the second layer 150 may be a nitride film, such as a silicon nitride ($SiN_x$) film. As another example, the first layer 140 may be a silicon nitride ($SiN_x$) film, and the first layer 150 may be a silicon oxide ($SiO_x$) film or an aluminum oxide ($Al_2O_3$) film. In some cases, one of the first layer 140 and the second layer 150 may be an oxide film or a nitride film, and the other may be an oxynitride film, such as silicon oxynitride ($SiON_x$). In addition to the above-described examples, the first layer 140 and the second layer 150 may be inorganic insulating films having different composition ratios of oxygen and nitrogen so as to react to different etchants or etching gases, and thereby, the first open region 140H and the second open region 150H may have different areas.

In the display device according to the present disclosure, because the part of the first open region 140H of the first layer 140 which is removed more than the second open region 150H of the second layer 150 is defined as the undercut UC, in order to stably connect the second electrode 190 to the extension 130a of the auxiliary wiring 130, the first layer 140 may be formed to have a thickness which is equal to or greater than the sum of the thickness of the organic layer 180 and the thickness of the second electrode 190. Each or any one of the first layer 140 and the second layer 150 may include a plurality of films formed of the same material. Alternatively, each or any one of the first layer 140 and the second layer 150 may include a plurality of films formed of materials having the same etching properties.

The first layer 140 may include a plurality of inorganic insulating films formed of the same component so as to correspond to the thickness of the undercut UC.

The passivation structure 1400 of the display device according to the present disclosure includes the first layer 140 and the second layer 150 having different composition ratios of oxygen and nitrogen, and thus exhibits an excellent function of preventing penetration of hydrogen from above the light emitting devices OLED compared to a single passivation film. Particularly, a film forming process may be performed at a high temperature exceeding 200° C., before formation of the organic layer 180. Therefore, the first and second layers 140 and 150 of the passivation structure 1400 may have high density, and may thus block downward migration of hydrogen and prevent changes in characteristics of the semiconductor layer of the thin film transistors. For example, in case of a thin film transistor including an oxide semiconductor layer, change in threshold voltage is greatly influenced by a hydrogen content, and therefore, in the display device according to the present disclosure, the passivation structure 140 configured to protect the thin film transistors includes a plurality of films formed of different materials having different composition ratios of oxygen and nitrogen, thereby being capable of strengthening the function of protecting the thin film transistors.

An encapsulation layer structure 300 may be formed so as to protect the light emitting devices OLED.

Because the organic layer 180 is easily denatured by heat and optical characteristics of the organic layer 180 are changed by heat, the second electrode 190 and the encapsulation layer structure 300 formed after formation of the organic layer 180 must be manufactured at a low-temperature lower than 200° C., particularly equal to or lower than 110° C., and more particularly equal to or lower than 80° C. Therefore, even though the encapsulation layer structure 300 includes inorganic encapsulation layers 310 and 330 for preventing moisture penetration, the film formation process of the encapsulation layer structure 300 is performed at a low temperature, and thus, densities of films used as the inorganic encapsulation layers 310 and 330 are low and hydrogen included in the inorganic encapsulation layers 310 and 330 easily migrates downwards. The passivation structure 1400 configured to protect the thin film transistors of the display device according to the present disclosure has relatively high density, thus being capable of preventing migration of hydrogen included in the inorganic encapsulation layers 310 and 330 and blocking diffusion of hydrogen into the thin film transistors provided under the passivation structure 1400. In this case, even though the inorganic encapsulation layers 310 and 330 are formed of a silicon nitride ($SiN_x$) film or a silicon oxynitride ($SiON_x$) film, the inorganic encapsulation layers 310 and 330 are formed by the low-temperature process, and thus, the densities of the inorganic encapsulation layers 310 and 330 are lower than the density of a silicon nitride ($SiN_x$) film or a silicon oxynitride ($SiON_x$) film included in the first layer 140 and/or the second layer 150 of the passivation structure 140, which is located below the organic layer 180 and may thus be formed by the high-temperature process. Therefore, the passivation structure 1400 may block diffusion of hydrogen from the inorganic encapsulation layers 310 and 330.

The auxiliary wiring 130 provided below the bank 170 is connected to the second electrode 190 of the light emitting device OLED provided in the emission part E through the extension 130a of the auxiliary wiring 130, thereby being capable of preventing voltage drop of the second electrode 190 and allowing the second electrode 190 to have uniform voltage throughout the entirety of the second electrode 190.

The auxiliary wiring 130 has the extensions 130a provided at one side thereof so as to be adjacent to corresponding transmission parts T, as shown in FIG. 1, and may thus have connections with the second electrodes 120. Here, the bank 170 may have the first holes 170H1 corresponding to the extensions 130a, the second holes 170H2 corresponding to the emission parts E, and the third holes 170H3 corresponding to the transmission parts T.

The light emitting device OLED is provided in each of the emission parts E, and the light emitting device OLED includes the first electrode 145 which is patterned, the organic layer 180 and the second electrode 190, which are sequentially stacked. The first electrode 145 is provided in each of the emission parts E so as to have a slightly larger size than the emission part E, and one side of the first electrode 145 may extend so as to form a first connection part CT1 connected to the thin film transistor provided below the light emitting device OLED. The part of the first electrode 145 extending from the size of the emission part E may overlap the bank 170, and may thus be shielded by the bank 170. The emission part E is defined by the second hole 170H2 of the bank 170 opposite the first electrode 145, and the first electrode 145, the organic layer 180 and the second electrode 190, which are vertically stacked in the emission part E, function as the light emitting device OLED.

In the display device according to the present disclosure, the organic layer 180 and the second electrode 190 may be formed on the substrate 100 without using a fine metal mask (FMM). Here, the passivation structure 1400 protecting the thin film transistors includes a plurality of layers, the undercut structure UC, in which the first open region 140H of the first layer 140 of the passivation structure 1400 is greater in size than the second open region 150H of the second layer 150, is provided so as to correspond to the extension 130a of the auxiliary wiring 130, and the organic layer 180 is disconnected at the undercut structure UC. Further, the second electrode 190 formed on the organic layer 180 has excellent step coverage compared to the organic layer 180, enters into the undercut structure UC, and is directly connected to the extension 130a of the auxiliary wiring 130. Therefore, the second electrode 190 may be connected to the extension 130a of the auxiliary wiring 130 without a fine metal mask configured to pattern the organic layer 180 and the second pattern 190. This is because the organic layer 180 and the second electrode 190 formed after formation of the undercut structure UC of the passivation structure 1400 have different deposition characteristics due to the organic material and the electrode material thereof. The second electrode 190 including the electrode material has relatively excellent step coverage.

The edge of the first electrode 145 of the light emitting device OLED may be covered with the bank 170 so as to be protected thereby, and the upper part of the first electrode 145 may be protected by the encapsulation layer structure 300 formed after formation of the organic layer 180 and the second electrode 190. The encapsulation layer structure 300 may include at least one organic encapsulation layer 320 and the inorganic encapsulation layers 310 and 330, which are stacked alternately with the organic encapsulation layer 320. The inorganic encapsulation layers 310 and 330, which prevent penetration of external moisture or ambient air, are formed to have a thickness sufficient to prevent the flow of particles generated from the inside of the display device, and prevent influence of the particles on the elements provided under the encapsulation layer structure 300. All the elements of the encapsulation layer structure 300 may be formed through a low-temperature process.

In the display device according to the present disclosure, the first electrode 145 of the light emitting device OLED may include the reflective metal layer 1412, and particularly, when the reflective metal layer 1412 includes a metal or a metal alloy having high reflectance, such as silver (Ag), a silver alloy, or Ag—Pd—Cu (APC), the reflective metal layer 1412 reflects light, traveling from the organic layer 180 towards the first electrode 145, upwards so as to exit, thereby being capable of improving luminous efficacy. In order to maintain stability in formation of the reflective metal layer 1412 and interfacial bonding properties of the reflective metal layer 1412, the first electrode 145 may further include a first transparent conductive film 1411 and a second transparent conductive film 1413 formed of a material, such as indium tin oxide (ITO), on the lower and upper surfaces of the reflective metal layer 1412, as shown in FIG. 2.

Because the display device according to the present disclosure may include the transmission parts T in addition to the emission parts E, as shown in FIG. 1, the organic layer 180 and the second electrode 190 are formed without using a fine metal mask, and may thus be left in the transmission parts T. Therefore, when the emission parts E are top emission-type emission parts, among the elements of the transmission parts T configured together with the light emitting devices OLED of the emission parts E, the second electrode 190 may be a transparent electrode formed of indium tin oxide (ITO) or indium zinc oxide (IZO) in order to increase transmittance of the transmission parts T. Further, because the area of the emission parts E is reduced when the area of the transmission parts T is increased, a reflective electrode having higher reflectance is required as the first electrode 145 in order to increase the luminous efficacy of each of the emission parts E. The display device according to the present disclosure forms the undercut UC through the passivation structure 1400 so as to achieve connection between the extension 130a of the auxiliary wiring 130 and the second electrode 190, and thus prevents exposure of the first electrode 145 or a first electrode dummy pattern formed in the same layer as the first electrode 145 in addition to the emission part E, thereby being capable of protecting the first electrode 145, i.e., the reflective electrode, which tends to be oxidized when exposed to the outside.

The organic layer 180 provided in the emission part E includes an emission layer, and the emission layer may be an organic emission layer, an inorganic emission layer including quantum dots, or a hybrid emission layer including an organic material and an inorganic material. In addition to the emission layer, the organic layer 180 may further include at least one of a hole injection layer, an auxiliary hole transport layer, a hole transport layer or an electron barrier layer, under the emission layer, and may further include at least one of a hole barrier layer, an electron transport layer or an electron injection layer, on the emission layer. In some cases, the organic layer 180 may include a plurality of stacks divided from each other by a charge generation layer. In this case, each stack may include a hole transport layer, an emission layer and an electron transport layer. One or more layers forming the organic layer 180 may be formed in the active area AA of the substrate 100 without a mask for region division. The active area AA in which display is substantially realized. At least one of a plurality of layers forming the organic layer 180, for example, the emission layer, may be selectively formed in the emission parts E using a fine metal mask having openings corresponding to the respective emission parts E.

After formation of the bank 170, the organic layer 180 including at least a hole injection layer, a hole transport layer, an electron transport layer and an electron injection layer, and the second electrode 190 may be formed in common in the active area AA. Some or all of the layers forming the organic layer 180 may not require a fine metal mask (FMM) having fine openings having sizes corresponding to the sizes of the respective emission parts E, and thus, when the organic layer 180 and the second electrode 190 are formed without a fine metal mask (FMM), some or all of the layers forming the organic layer 180 may be continuously formed without disconnection between adjacent emission parts E and between adjacent emission and transmission parts E and T. In this case, because the second electrode 190 is also formed without a fine metal mask (FMM) in addition to the organic layer 180, it is difficult to achieve direct connection between the second electrode 190 and the auxiliary wiring 130 due to the presence of the organic layer 180 provided under the second electrode 180, and therefore, in the display device according to the present disclosure, the undercut UC is prepared in the passivation structure 1400 located under the first hole 170H1 of the bank 170 before formation of the organic layer 180, so that the second layer 150 protrudes compared to the first layer 140 having the undercut UC, thereby facilitating conductive connection between the second electrode 190 and the extension 130a of the auxiliary wiring 130.

That is, in the display device according to the preset disclosure, the undercut UC is defined by protruding the second layer 150 compared to the first layer 140 of the passivation structure 1400 without changing a separate deposition mask or using a fine metal mask (FMM), and the second electrode 190 enters into the undercut region more than the organic layer 180 and may thus be directly connected to the extension 130a of the auxiliary wiring 130 while covering the organic layer 180 in the undercut region. Here, the organic layer 180 may be formed not only on the upper parts of the first electrodes 145 of the emission parts E but also on the upper and side parts of the bank 170, the side part of the organic insulating film 160 and the upper surface of the second layer 150 exposed from the organic insulating film 160.

A capping layer (not shown) may be further formed on the second electrode 190 of the light emitting devices OLED so as to improve extraction of light and to protect the light emitting devices OLED. When the capping layer is further formed, the encapsulation layer structure 300 is formed after formation of the capping layer.

In the encapsulation layer structure 300, the first inorganic encapsulation layer 310 located as the lowermost layer may enter into the undercut UC and thus fill the undercut UC, and in this case, hydrogen generated from the first inorganic encapsulation layer 310 may not influence the thin film transistors provided in the emission parts E or non-emission parts through the hydrogen collection function of the first layer 140. Further, the auxiliary wirings 130 and the extensions 130a thereof may use a metal having the hydrogen collection function, such as MoTi, thus being capable of improving a function of preventing hydrogen diffusion.

The display device according to the present disclosure includes the transmission parts T occupying a designated area or more so that elements on the rear surface of the display device are visible like glass, and the transmission parts T may transmit light like a kind of transparent film. When the display device includes the transmission parts T, the display device may be used as a transparent display device. On the other hand, when the display device according to the present disclosure does not include the transmission parts T, the display device includes the first electrode 145 including the reflective metal layer 1412 and has the undercut UC in the passivation structure 1400, thereby being capable of connecting the second electrode 190 to the extension 130a of the auxiliary wiring 130 at the undercut UC in the passivation structure 1400 while securing reliability of the first electrode 145 and preventing diffusion of hydrogen into the thin film transistors.

By conductively connecting the first electrode 145 of the light emitting device OLED to the thin film transistor TFT, the light emitting device OLED may selectively emit light in response to the turning-on/off of the corresponding thin film transistor. That is, the display device according to the present disclosure may achieve both light transmission and light emission through the emission parts E and the transmission parts T. Here, the emission parts E may include green, white, blue and red emission parts, and a color emission layer configured to selectively emit light with a corresponding color may be provided in each emission part E, or a color filter layer (not shown) may be provided on the encapsulation layer structure 300 or on an opposite substrate (not shown) so as to implement color display. In the latter case, the light emitting devices OLED provided in the emission parts E of the respective subpixels may emit white light in common, or in some cases, may include color emission layers configured to emit light with colors corresponding to the respective color filters thereof in order to improve cavity effects of light. The emission parts E may include white emission parts, and in this case, the color filter layer may be omitted in the white emission parts. When voltage is applied to the thin film transistors connected to the emission parts E, the respective emission parts E emit light with corresponding colors and thus display an image.

In FIGS. 2 and 3, non-described reference numeral 110 indicates a first interlayer insulating film, and non-descried reference numeral 120 indicates a second interlayer insulating film, and the first and second interlayer insulating films 110 and 120 are formed between electrodes forming the thin film transistors or between the electrodes and other wrings. The first and second interlayer insulating films 110 and 120 may be silicon oxide films, silicon nitride films or silicon oxynitride films.

Hereinafter, a method for manufacturing the display device according to one aspect of the present disclosure will be described with reference to longitudinal-sectional views taken along line II-II' of FIG. 1.

FIGS. 4A to 4F are longitudinal-sectional views illustrating the method for manufacturing the display device according to one aspect of the present disclosure.

Figure 4A:
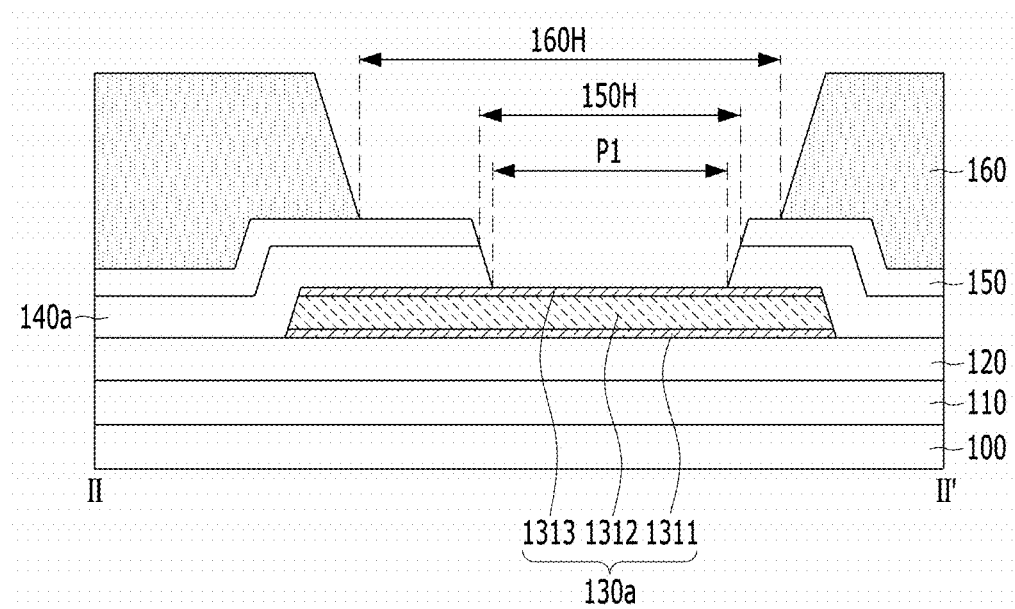
FIGS. 4A to 4F are longitudinal-sectional views illustrating a method for manufacturing the display device according to one aspect of the present disclosure.
Figure 9:
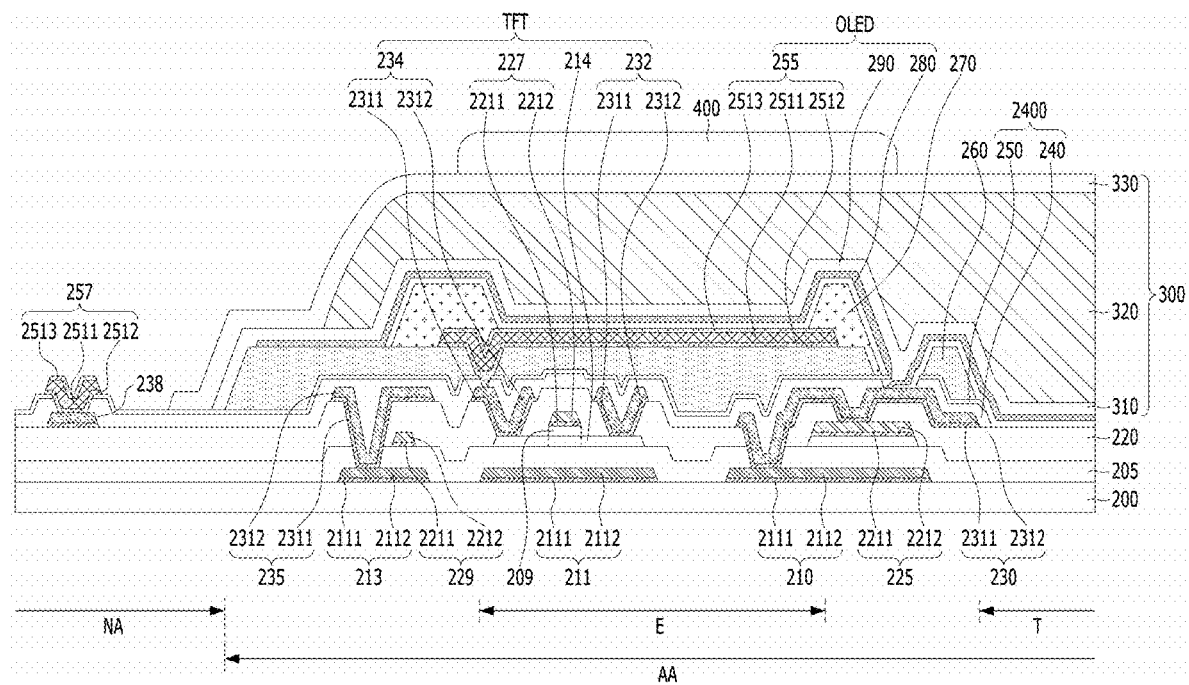
FIG. 9 is a longitudinal-sectional view illustrating a display device according to another aspect of the present disclosure.

In FIGS. 4A and 4G, an illustration of the thin film transistor TFT is omitted, and thus, the thin film transistor TFT shown in FIG. 9 will be referred to. The auxiliary wiring 130 and the extension 130a thereof are formed in the same layer as a source electrode and a drain electrode of the thin film transistor TFT.

As shown in FIG. 4A, a light-shielding layer (with reference to 210, 211 and 213 in FIG. 9) is formed on the substrate 100, and then, the first interlayer insulating film 110 is formed thereon.

Thereafter, a semiconductor layer (with reference to 214 in FIG. 9) is formed on the first interlayer insulating film 110, and a gate insulating film (with reference 209 in FIG. 9) and a gate electrode 227 are formed in designated regions on the semiconductor layer. Gate lines (not shown) may be formed in the first direction of FIG. 1 in the same layer as the gate electrode 227.

Thereafter, the second interlayer insulating film 120 is formed so as to cover the gate electrode 227.

Thereafter, the auxiliary wirings 130 and the extensions 130a of the auxiliary wirings 130 are formed on the second interlayer insulating film 120. The auxiliary wirings 130 and the extensions 130a thereof may have a three-layer structure including a base metal layer 1312 having high conductivity, and first and second functional layers 1311 and 1313 provided on the lower and upper surfaces of the base metal layer 1312 so as to have a function of improving interfacial bonding properties and a function of preventing hydrogen diffusion. Otherwise, the auxiliary wirings 130 and the extensions 130a thereof may have a two-layer structure including the base metal layer 1312 having high conductivity and the first functional layer 1311 provided on the lower surface of the base metal layer 1312 so as to have the function of improving interfacial bonding properties and the function of preventing hydrogen diffusion. The base metal layer 1312 may be formed of, for example, a metal having high conductivity, such as aluminum (Al), chromium (Cr), copper (Cu), titanium (Ti), molybdenum (Mo) or tungsten (W), or an alloy including at least one of these metals, and the first and second functional layers 1311 and 1313 may be formed of a metal or a transparent metal, which may have a function of collecting hydrogen, or an alloy including at least one of these metals, such as MoTi, Ti or ITO.

Thereafter, after the first layer 140a and the second layer 150 having different ratios of oxygen and nitrogen are sequentially deposited, an open region P1 is formed by selectively removing the first layer 140a and the second layer 150 with a mask (not shown) having a first opening (corresponding to the open region P1). FIG. 4A exemplarily illustrates wet etching, and a relatively larger area of an upper portion having a larger contact area with a wet etchant is removed and a relatively smaller area of a lower portion is removed. That is, the second layer 150 and the first layer 140a are removed such that the removed portions thereof form a side wall having a regular tapered shape from the upper portion of the second layer 150 to the lower portion of the first layer 140a. In this case, a second open region 150H formed at the lower portion of the second layer 150 may be greater in size than the open region P1 formed at the lower portion of the first layer 140a.

FIG. 4A illustrates merely one example, and as another example, when the open regions of the first and second layers 140a and 150 are formed using dry etching, the first layer 140a and the second layer 150 may have open regions P1 and 150H having the same width. In this case, the open region P1 of the first layer 140a and the second open region 150H of the second layer 150 may have the same size.

Thereafter, the organic insulating film 160 may be formed of an organic material, such as photoacryl or benzocyclobutene (BCB), on the second layer 150 so as to planarize the surface of the second layer 150, and the hole 160H having a greater size than the open region 150H of the second layer 150 above the extension 130a of the auxiliary wiring 130 may be formed through the organic insulating film 160 by patterning the organic insulating film 160. In the display device having transmission parts T, when the hole 160H of the organic insulating film 160 is formed, the organic insulating film 160 may be removed from regions corresponding to the transmission parts T, thereby being capable of increasing transmittance of the transmission parts T.

As shown in FIGS. 1 and 2, the first electrode 145 is formed by sequentially depositing the first transparent electrode layer 1411, the reflective metal layer 1412 and the second transparent electrode layer 1413 on the organic insulating film 160 and then selectively removing these layers 1411, 1412 and 1413. The first electrode 145 is formed to have a slightly larger size than the emission part E, and thus, upward reflection of light from the emission part E through the first electrode 145 may be effectively performed, and the first electrode 145 may be connected to the thin film transistor through the first connection part CT1 outside the emission part E.

Figure 4B:
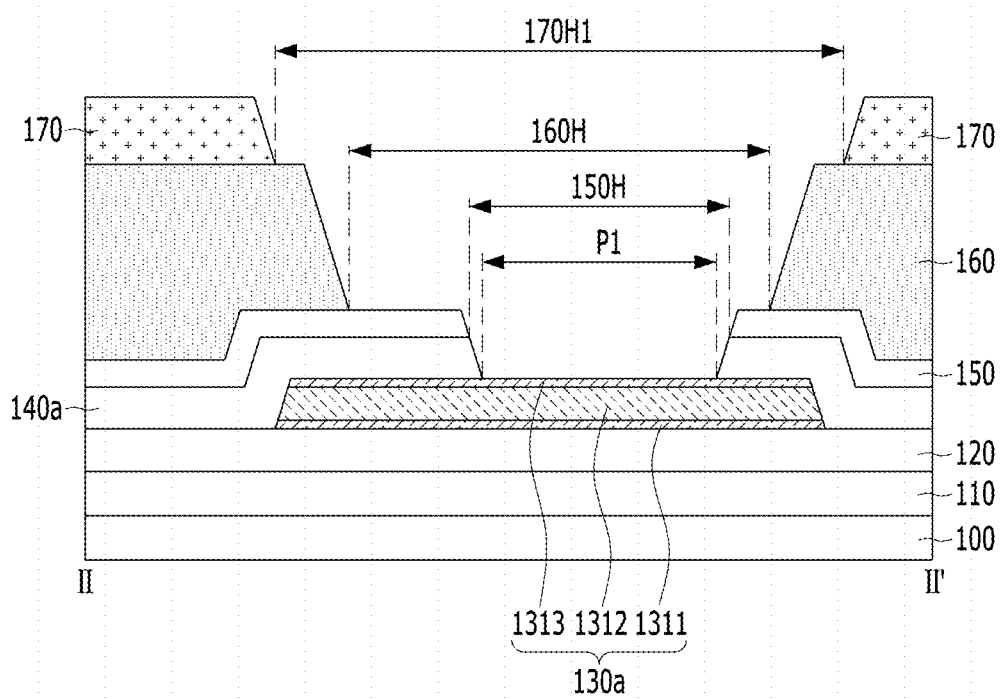

As shown in FIG. 4B, the bank 170 having the first holes 170H1 corresponding to the extensions 130a, the second holes 170H2 corresponding to the emission parts E, and the third holes 170H3 corresponding to the transmission parts T is formed by applying a bank material to the surface of the organic insulating film 160 and selectively removing the bank material.

Figure 4C:
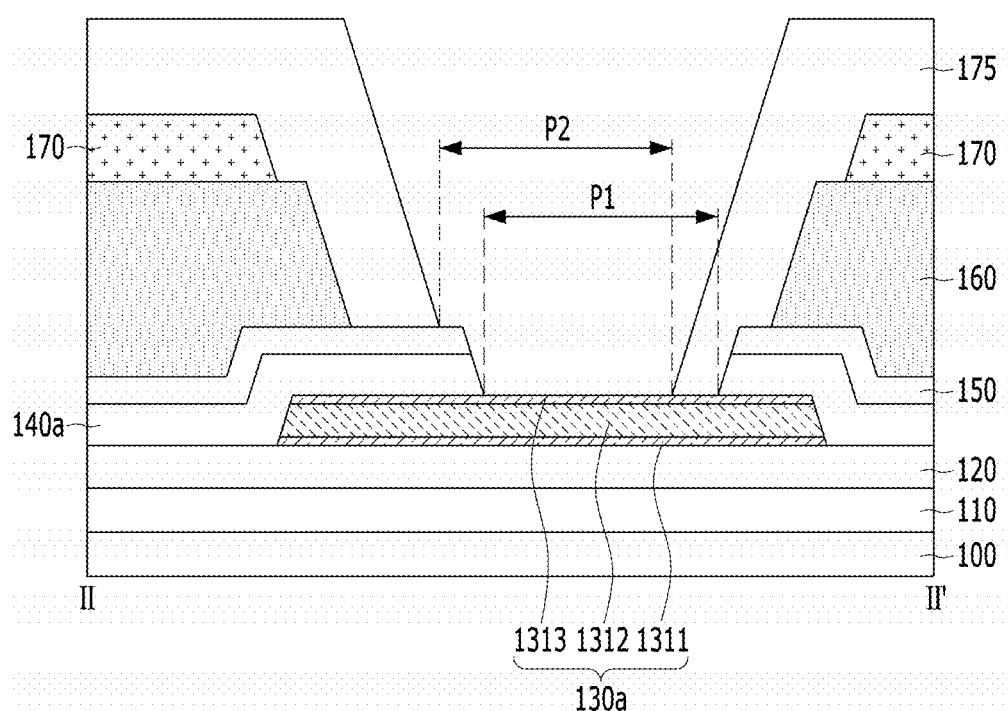

As shown in FIG. 4C, in order to selectively remove the first layer 140a, a photoresist pattern 175 configured to shield one side of each of the first and second layers 140 and 150 and to have an open region P2 to open the remaining side of each of the first and second layers 140 and 150 is formed. One side of the photoresist pattern 175 configured to shield one side of each of the first and second layers 140 and 150 extends to the extension 130a of the auxiliary wiring 130, and the other side of the photoresist pattern 175 extends to the second layer 150 so as to open a part of the upper surface of the second layer 150 and the side parts of the first and second layers 140 and 150. The open region P2 of the photoresist pattern 175 may be located at a position which is shifted laterally from the open region P1 of the first layer 140 formed in the process shown in FIG. 4A by about the length a of the undercut UC.

Figure 4D:
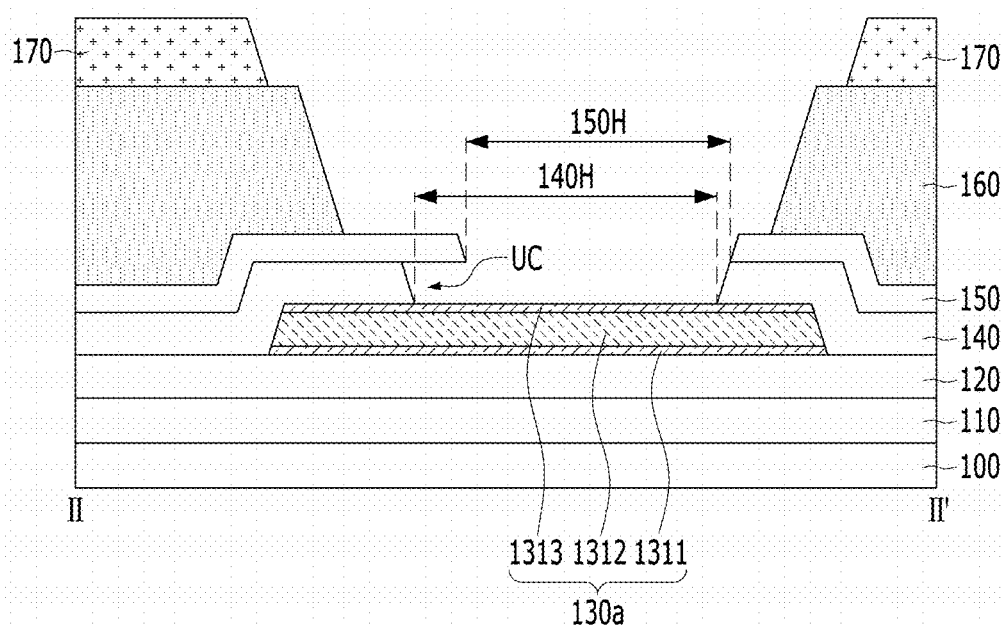

Thereafter, in the state in which the photoresist pattern 175 is prepared, as shown in FIG. 4D, the undercut UC is formed by removing the exposed side part of the first layer 140 using an etchant or etching gas having no etching reactivity to the material of the second layer 150 and having etching reactivity to the material of the first layer 140. Here, the second layer 150 has no reactivity to the etchant or the etching gas when the first layer 140 is selectively etched, thus being capable of maintaining the open region 150H, as shown in FIG. 4A. On the other hand, the exposed side part of the first layer 140 is removed with the etchant or the etching gas, and thus, the first layer 140 is removed more than the second layer 150 by the designated width a, thereby being capable of defining the undercut UC.

As such, the first layer 140, in which the undercut UC is defined, and the second layer 150 are referred to as the passivation structure 1400.

Figure 4E:
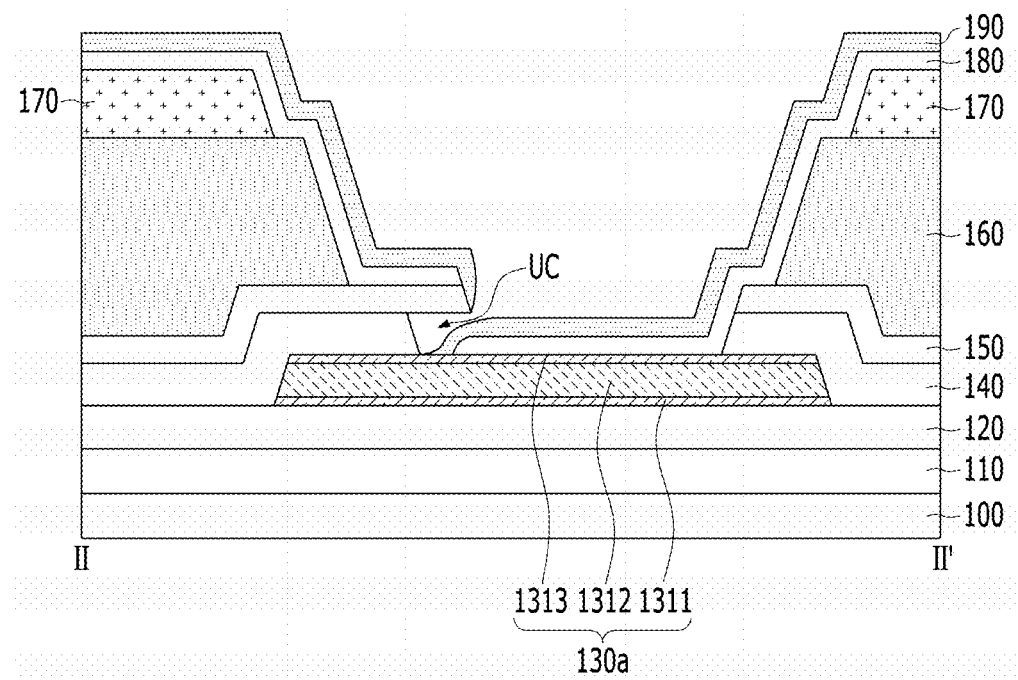

Thereafter, as shown in FIG. 4E, the organic layer 180 and the second electrode 190 are sequentially formed. Even though the organic layer 180 is formed without using a fine metal mask, the organic layer 180 may be disconnected in the undercut region by the first layer 140 and the second layer 150 having the open regions 140H and 150H having a size difference. That is, because the second layer 150 protrudes more than the first layer 140 having the undercut, the second layer 150 serves as a shade when the organic layer 180 is deposited, and may prevent the organic layer 180 from being deposited on a region of the extension 130a, in which the first layer 140 is removed, below the second layer 150. The second electrode 190 includes a metal material, such as indium, zinc or titanium, has excellent step coverage compared to the organic layer 180, and may thus be deposited so as to enter into the undercut region. Thereby, after deposition of the second electrode 190, the second electrode 190 may be connected to the extension 130a of the auxiliary wiring 130.

After formation of the second electrode 190, the capping layer (not shown) may be further formed on the second electrode 190.

The first electrode 145, the organic layer 180 and the second electrode 190 formed in the emission part form the light emitting device OLED.

Figure 4F:
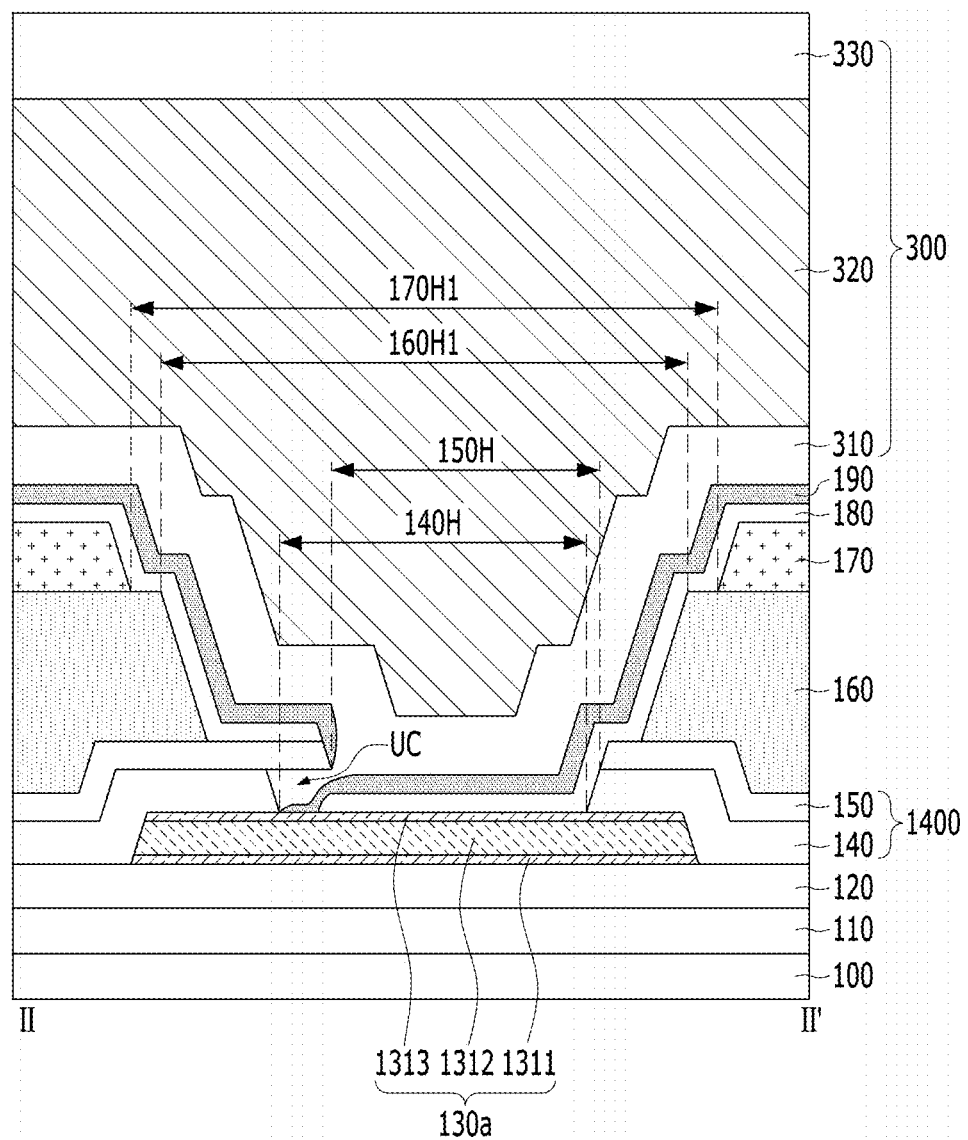

Thereafter, as shown in FIG. 4F, the encapsulation layer structure 300 is formed by sequentially forming the first inorganic encapsulation layer 310, the organic encapsulation layer 320 and the second inorganic encapsulation layer 330 on the second electrode 190.

As such, in the method for manufacturing the display device according to one aspect of the present disclosure, the passivation structure 1400 protecting the thin film transistors includes a plurality of layers, the undercut structure UC, in which the first open region 140H of the first layer 140 of the passivation structure 1400 is greater in size than the second open region 150H of the second layer 150, is provided so as to correspond to the extension 130a of the auxiliary wiring 130, the organic layer 180 is disconnected at the undercut structure, and thereby, the second electrode 190 may be directly connected to the extension 130a of the auxiliary wiring 130, and changes in the characteristics of the thin film transistors may be prevented due to the multilayer passivation structure 1400.

Hereinafter, compared to the above-described undercut structure in the passivation structure of the display device according to the present disclosure, Test Example 1, in which a first electrode dummy pattern is formed of the same metal in the same layer as a first electrode including a reflective electrode and an undercut is formed due to a width difference between the first electrode dummy pattern and an overcoat layer provided thereunder, will be examined.

Figure 5A:
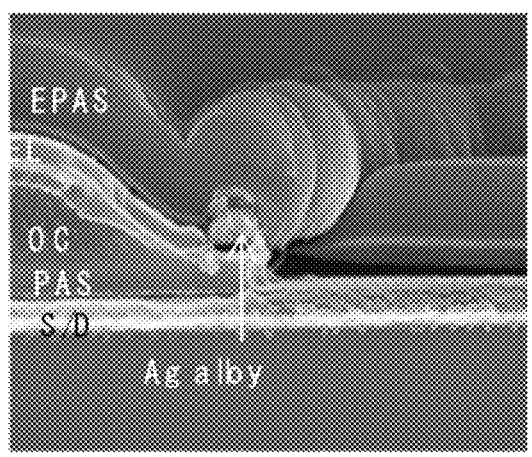
FIG. 5A is an SEM image of a display device to which an undercut structure according to Test Example 1 is applied.

FIG. 5A is an SEM image of a display device to which an undercut structure according to Test Example 1 is applied.

In Test Example 1, as shown in FIG. 5A, when the first electrode (anode) dummy pattern includes silver (Ag) having high reflectance, such as an Ag alloy, because the undercut structure is formed between the first electrode dummy pattern and the overcoat layer by protruding the first electrode dummy pattern more than the overcoat layer OC provided thereunder, silver (Ag) having high reflectance in the protruding first electrode dummy pattern is oxidized, and thus rises and swells, and causes deformation of the shapes of an organic layer EL and a cathode, which are subsequently formed thereon, thereby causing a connection failure between an auxiliary wiring S/D and the cathode, i.e., a second electrode.

In a display device including transmission parts, because the area of emission parts is reduced due to presence of the transmission parts, in a situation in which the respective emission parts require high efficiency and essentially require use of highly reflective metal, when the dummy pattern of a first electrode (anode) including a highly reflective metal has a protruding tip, swelling of the highly reflective first electrode dummy pattern in the subsequent process may occur as in Test Example 1 shown in FIG. 5A. Therefore, the inventors of the present disclosure propose a method which the side part of the first electrode 145 is protected by the bank 170, and an undercut part (void part) is formed by changing a different layer from the first electrode 145, particularly the passivation structure 1400.

Thereby, exposure of the side part of the auxiliary connection pattern including the reflective metal layer to the outside is prevented, deformation of the first electrode using the reflective metal is prevented, and thereby, a reliable connection structure between the auxiliary wiring and the second electrode may be realized.

Figure 5B:
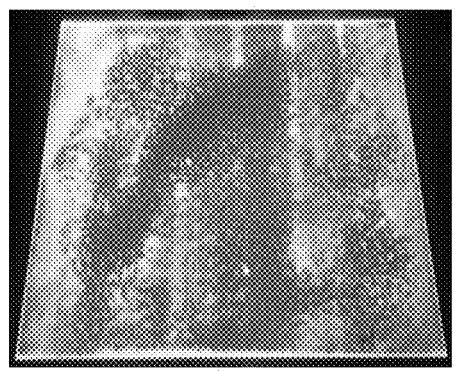
FIG. 5B is a photograph representing mura occurring on the surface of a display device to which a single passivation film according to Test Example 2 is applied.

FIG. 5B is a photograph representing mura occurring on the surface of a display device to which a single passivation film according to Test Example 2 is applied.

FIG. 5B is a photograph representing, when the display device includes thin film transistors including an oxide semiconductor layer according to Test Example 2, the surface of the display device after formation of a passivation film using a single silicon oxide ($SiO_x$) film. However, the passivation film using the oxide film may block hydrogen generated from the inside of a thin film transistor array but, when an encapsulation layer structure is formed on light emitting devices provided above the thin film transistors by a low-temperature process, the densities of inorganic encapsulation layers included in the encapsulation layer structure are low and thus hydrogen ion contents in the inorganic encapsulation layers are high, and hydrogen ions in the inorganic encapsulation layers may migrate towards elements under the encapsulation layer structure in the display device according to Test Example 2. FIG. 5B illustrates that the hydrogen ions generated from the inorganic encapsulation layers migrate to the thin film transistors provided therebelow and impart conductivity to the channels of the thin film transistors, and thus cause mura on the surface of the display device.

Recently, display devices are gradually developed to satisfy the requirements of slimness and flexibility, and for this purpose, the substrate 100 is formed of a flexible material and the thicknesses of elements provided on the substrate 100 tend to be reduced. Therefore, an encapsulation substrate disposed opposite the substrate 100 is omitted, and the encapsulation layer structure 300 including the inorganic encapsulation layers 310 and 330 and the organic encapsulation layer 320, which are alternately stacked, as described above, may be formed so as to protect the light emitting devices from ambient air and to prevent moisture penetration thereinto.

Further, in the display device, in order to prevent deformation of the flexible substrate 100 due to heat applied during a thin film transistor array formation process, instead of polysilicon requiring a high-temperature process executed at a high temperature equal to or higher than 400° C., the semiconductor layer (active layer) may be formed of an oxide semiconductor manufactured at a temperature lower than the above temperature.

The oxide semiconductor is formed of an oxide film including at least one of indium (In), gallium (Ga) or zinc (Zn), when polarized ions, such as hydrogen ions, enter into a channel formed in the oxide semiconductor, threshold voltage characteristics are drastically changed, and in order to prevent such change, the passivation film having the function of preventing hydrogen diffusion is formed.

Figure 6:
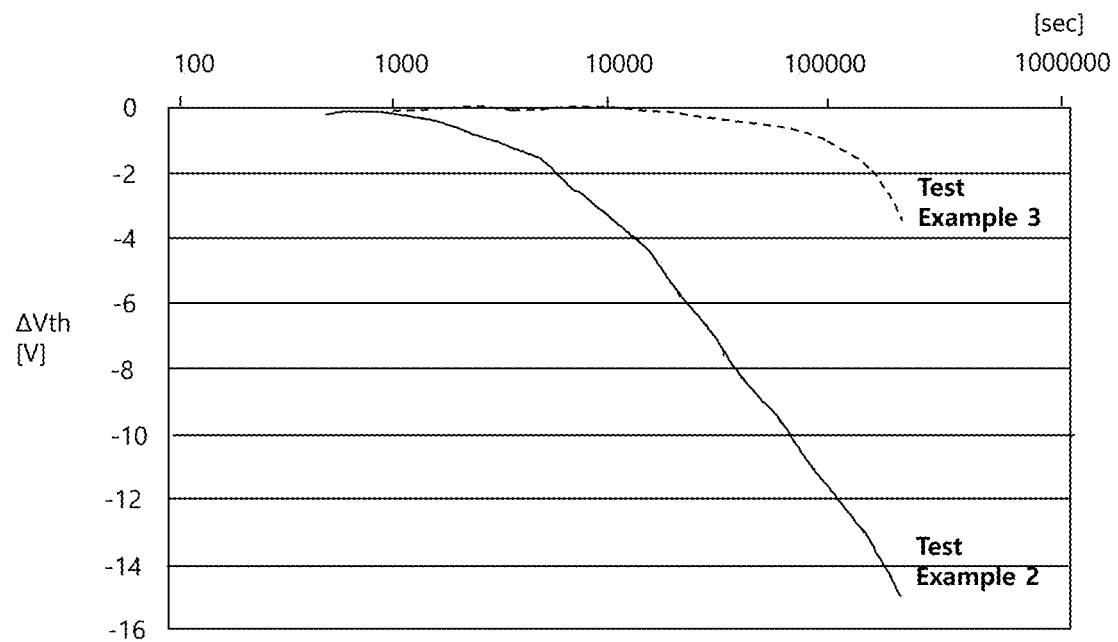
FIG. 6 is a graph representing negative bias thermal stress (NBTS) characteristics at a high temperature of the display device according to Test Example 2 and a display device according to Test Example 3.

FIG. 6 is a graph representing negative bias thermal stress (NBTS) characteristics at a high temperature of the display device according to Test Example 2 and a display device according to Test Example 3.

In Test Example 2, the single passivation film is used to protect the thin film transistors, and in Test Example 3, a two-layer passivation structure including a first layer and a second layer is used to protect thin film transistors, as shown in FIGS. 1 to 3. Elements other than the passivation film in Test Example 2 and Test Example 3 are the same.

In order to examine negative bias thermal stress (NBTS) characteristics, after formation of an encapsulation layer structure of a display device, change in the threshold voltage of thin film transistors under severe conditions of a temperature of about 110° C. is observed. Here, inorganic encapsulation layers of the encapsulation layer structure are nitride films formed at a low temperature.

In Test Example 3, the two-layer passivation structure including the first layer and the second layer is applied, like the display device according to one aspect of the present disclosure described with reference to FIGS. 1 to 3, the first layer is formed of a silicon oxide ($SiO_x$) film, and the second layer is formed of a silicon nitride ($SiN_x$) film. Both the first and the second films are formed at a high temperature equal to or higher than 200° C., source electrodes and drain electrodes of the thin film transistors directly contact the first layer, and the first layer has a greater thickness than the thickness of the second layer.

In Test example 2, the single passivation film is formed of a single oxide film.

In the NBTS test, a threshold voltage shift of −14 V occurred in the display device according to Test example 2 after $10^5$ seconds elapse, and a threshold voltage shift of −4 V occurred in the display device according to Test example 3 after $10^5$ seconds elapse, and thereby, it may be confirmed that, when the multilayer passivation film is applied, changes in the characteristics of the thin film transistors may be greatly prevented due to prevention of hydrogen diffusion. The multilayer passivation film of Test Example 3, which further includes the second layer having a smaller thickness than that of the first layer and a different composition ratio of oxygen and nitrogen from that of the first layer, may reduce change in threshold voltage to half or more compared to the structure having the single passivation film formed of the same material as the multilayer passivation film and having a thickness corresponding to the sum of the thickness of the first layer and the thickness of the second layer.

Further, a threshold voltage shift of −4 V occurred in the display device according to Test example 2 after $10^4$ seconds elapse, but a threshold voltage shift of −4 V occurred in the display device according to Test example 3 after $10^5$ seconds elapse, and thereby, it may be confirmed that the display device according to Test example 3 has stability over time.

Figure 7:
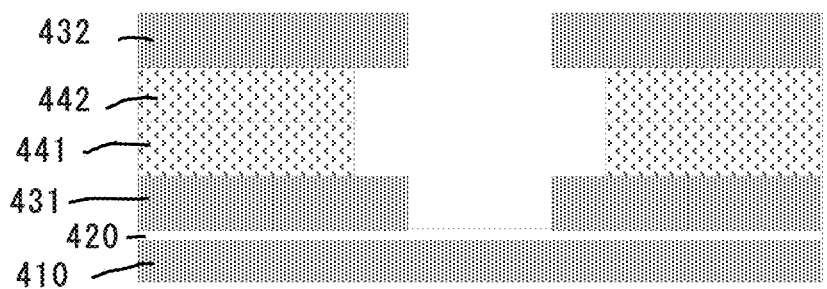
FIG. 7 is a longitudinal-sectional view illustrating the evaluated structure of an undercut of a multilayer passivation structure according to Test Example 4.
Figure 8:
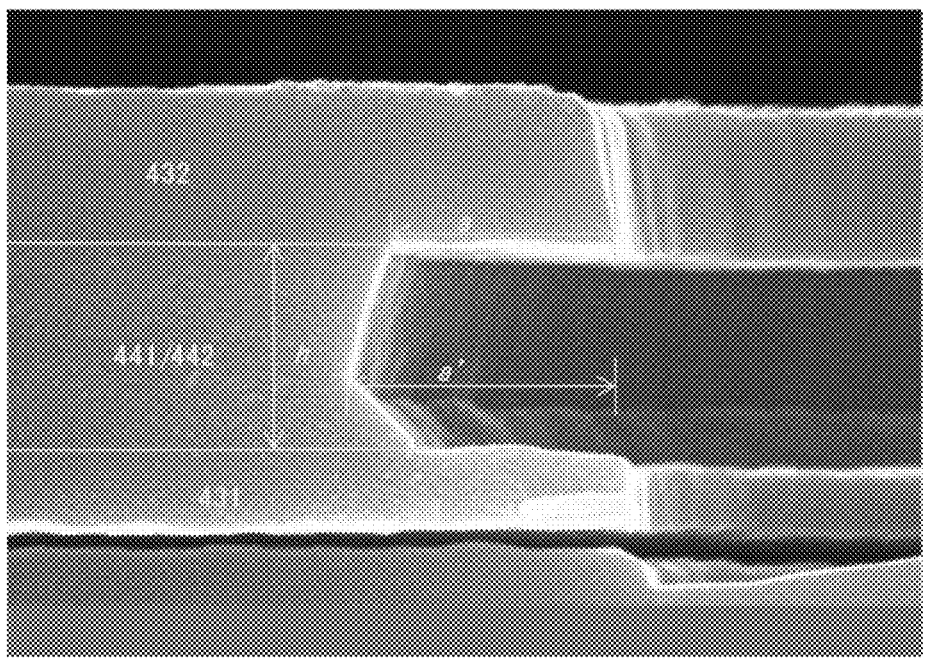
FIG. 8 is an SEM image representing the multilayer passivation structure according to Test Example 4 shown in FIG. 7 after dry etching.

FIG. 7 is a longitudinal-sectional view illustrating the evaluated structure of an undercut of a multilayer passivation structure according to Test Example 4, and FIG. 8 is an SEM image representing the multilayer passivation structure according to Test Example 4 shown in FIG. 7 after dry etching.

Test Example 4 shown in FIG. 7 represents a target structure in which an oxide film and a nitride film having different components have open regions having different widths.

In the target structure of Test Example 4, a separation film 420 is formed on a base film 410, a first oxide film 431, a first nitride film 441, a second nitride film 442 and a second oxide film 431 are sequentially formed thereon, the first oxide film 431, the first nitride film 441, the second nitride film 442 and the second oxide film 431 are primarily removed by the same width under first conditions, and then, the first and second nitride films 441 and 442 formed of a nitride film component are secondarily more removed under second conditions so as to have a different width from the first and second oxide films 431 and 432.

For example, sulfur hexafluoride ($SF_6$) and argon (Ar) were used in a ratio of 1:3 ($SF_6$:Ar) as etching gases under the first conditions, and sulfur hexafluoride ($SF_6$) and argon (Ar) were used in a ratio of 3:1 ($SF_6$:Ar) as etching gases under the second conditions.

After dry etching was completed using the etching gases at different ratios of $SF_6$:Ar, it may be confirmed from FIG. 8, illustrating an etched state on the separation film 420, that the first and second nitride films 441 and 442 are removed more than the first and second oxide films 431 and 432. In a layer structure including films having different composition ratios, such as an oxide film and a nitride film, the two films may be patterned so as to have open regions having the same width or similar widths, and thereafter, the lower film among the two films may be selectively more removed by reaction gases or an etchant having reactivity to the lower film. In this case, as shown in FIG. 8, it may be confirmed that, even if some parts of the first and second nitride films 441 and 442 are removed, an undercut having a height h and a length a is formed between the second oxide films 432 remaining on the first and second nitride films 441 and 442 and the first and second nitride films 441 and 442. The height h corresponds to the sum of the thickness of the first nitride film 441 and the thickness of the second nitride film 442, and the thickness required by the undercut may be adjusted by controlling the deposition thicknesses of the first and second nitride films 441 and 442. The length a may be adjusted within the range of about 0.4 μm to 2 μm.

Test Example 4 shown in FIGS. 7 and 8 is merely one example, and films configured to be relatively more etched by varying etching gases or an etchant may be oxide films and a film configured to protrude on the oxide films may be a nitride film.

Through Test Example 4, it may be confirmed that an undercut structure may be secured in a stack of inorganic films having different composition ratios.

Hereinafter, a display device according to another aspect of the present disclosure will be described.

FIG. 9 is a longitudinal-sectional view illustrating the display device according to another aspect of the present disclosure.

As shown in FIG. 9, the display device according to another aspect of the present disclosure may include a substrate 200 having emission parts E, transmission parts T and auxiliary connection parts CTA, auxiliary wirings 230 provided in the auxiliary connection parts CTA of the substrate 200, a passivation structure 2400 formed by stacking a first layer 240 and a second layer 250 and configured such that an open region of the first layer 240 is greater in size than an open region of the second layer 250 with respect to the auxiliary wiring 230, a bank 270 provided on the passivation structure 2400 and configured to have holes, which is greater in size than the open region of the first layer 240, corresponding to the auxiliary connection parts CTA, and holes respectively corresponding to the emission parts E and the transmission parts T, and light emitting devices OLED respectively provided in emission parts E, each of the light emitting devices OLED including a first electrode 255 including a reflective metal layer 2511, an organic layer 280 including at least one emission layer, and a second electrode 290, and the second electrode 290 may be directly connected to the auxiliary wiring 230 in the open region of the first layer 240 under the second layer 250.

FIG. 9 illustrates a non-active area NA including pad electrodes 238, and an active area AA including storage capacitor regions Cst, the emission parts E, the transmission parts T and the auxiliary connection parts CTA. A detailed description of some parts in this aspect, which are substantially the same as those in the aspect described above with reference to FIGS. 1 to 3, will be omitted, and elements, which are additionally provided in this aspect, will be described in detail.

A light-shielding layer 211 may be provided on the substrate 200 so as to block light from the lower part of an oxide semiconductor layer 214, and light-shielding patterns 210 and 213 may be formed in the same layer as the light-shielding layer 211. The light-shielding patterns 210 and 213 may function as lines configured to apply voltage to the auxiliary wiring 230 and a first storage electrode 235, respectively.

A buffer layer (not shown) may be further formed between the substrate 200 and the light-shielding patterns 210 and 213 and the light-shielding layer 211 so as to prevent impurities of the substrate 200 from penetrating into a thin film transistor array provided thereon.

The light-shielding patterns 210 and 213 and the light-shielding layer 211 may include a first metal layer 2111 and a second metal layer 2112, as shown in this figure. However, the light-shielding patterns 210 and 213 and the light-shielding layer 211 are not limited thereto, and may be formed as a single layer or include a plurality of layers. The first and second metal layers 2111 and 2112 may be formed of a metal having high conductivity, such as aluminum (Al), chromium (Cr), copper (Cu), titanium (Ti), molybdenum (Mo) or tungsten (W), or an alloy including at least one of these metals. Particularly, when the first and second metal layers 2111 and 2112 are formed of a metal or a metal alloy which may collect hydrogen, such as MoTi, the first and second metal layers 2111 and 2112 may prevent deformation of the oxide semiconductor layer 214 due to hydrogen included in the substrate 200 or a first interlayer insulating film 205.

The first interlayer insulating film 205 may be formed so as to cover the light-shielding patterns 210 and 213 and the light-shielding layer 211.

Further, the oxide semiconductor layer 214 may be formed on the first interlayer insulating film 205 so as to overlap the light-shielding layer 211. Here, the oxide semiconductor layer 214 may be formed as a different semiconductor, such as polysilicon or the like. When the oxide semiconductor layer 214 is formed and the passivation structure 2400 according to the present disclosure is applied, changes in the characteristics of the oxide semiconductor layer 214 may be more effectively prevented.

Each of thin film transistors TFT includes the oxide semiconductor layer 214, a gate electrode 227 configured to overlap the channel of the semiconductor layer 214 with a gate insulating film 209 interposed therebetween, and a source electrode 232 and a drain electrode 234 spaced apart from the gate electrode 227 and connected to both sides of the semiconductor layer 214.

A second storage electrode 229 may be formed in the same layer as the gate electrode 227 in the storage capacitor region Cst, and an auxiliary connection pattern 225 may be formed in the auxiliary connection part CTA. The auxiliary connection pattern 225 may be omitted.

The gate electrode 227, the second storage electrode 229 and the auxiliary connection pattern 225 may include a third metal layers 2211 and a fourth metal layer 2212, as shown in this figure. However, the gate electrode 227, the second storage electrode 229 and the auxiliary connection pattern 225 are not limited thereto, and may be formed as a single layer or include a plurality of layers. The third and fourth metal layers 2211 and 2212 may be formed of a metal having high conductivity, such as aluminum (Al), chromium (Cr), copper (Cu), titanium (Ti), molybdenum (Mo) or tungsten (W), or an alloy including at least one of these metals. Particularly, when the third and fourth metal layers 2211 and 2212 are formed of a metal or a metal alloy which may collect hydrogen, such as MoTi, the third and fourth metal layers 2211 and 2212 may prevent deformation of the oxide semiconductor layer 214 due to hydrogen generated from the inside of the device or migrating from other layers.

A second interlayer insulating film 220 is formed so as to cover the gate electrode 227, the second storage electrode 229 and the auxiliary connection pattern 225.

The auxiliary wiring 230, the source electrode 232, the drain electrode 234 and the first storage electrode 235 are formed on the second interlayer insulating film 220. In the same process, the pad electrodes 238 may be formed in the non-active area NA.

One side of each of the first storage electrode 235 and the auxiliary wiring 230 may be connected to a corresponding one of the light-shielding patterns 213 and 210 by through holes formed through the first and second interlayer insulating films 205 and 220. A connection hole may be formed by selectively removing the second interlayer insulating film 220 so as to expose a part of the auxiliary connection pattern 225, thus being capable of connecting the auxiliary connection pattern 225 to the auxiliary wiring 230.

The pad electrodes 238, the auxiliary wiring 230, the source electrode 232, the drain electrode 234 and the first storage electrode 235 may include a fifth metal layer 2311 and a sixth metal layer 2312. However, the pad electrodes 238, the auxiliary wirings 230, the source electrode 232, the drain electrode 234 and the first storage electrode 235 are not limited thereto, and may be formed as a single layer or include a plurality of layers. Like the auxiliary wiring 130 shown in FIGS. 2 and 3, the pad electrodes 238, the auxiliary wiring 230, the source electrode 232, the drain electrode 234 and the first storage electrode 235 may have a three-layer structure.

The fifth and sixth metal layers 2311 and 2312 may be formed of a metal having high conductivity, such as aluminum (Al), chromium (Cr), copper (Cu), titanium (Ti), molybdenum (Mo) or tungsten (W), or an alloy including at least one of these metals. Particularly, when the fifth and sixth metal layers 2311 and 2312 are formed of a metal or a metal alloy which may collect hydrogen, such as MoTi, the fifth and sixth metal layers 2311 and 2312 may prevent deformation of the oxide semiconductor layer 214 due to hydrogen generated from the inside of the device or migrating from other layers.

The passivation structure 2400 is acquired by forming the first layer 240 and the second layer 250 formed of at least different inorganic insulating films on the pad electrodes 238, the auxiliary wiring 230, the source electrode 232, the drain electrode 234 and the first storage electrode 235, and an undercut structure configured to expose a part of the auxiliary wiring 230 is formed by removing a partial width of the first layer 240 more than the second layer 250, as shown in FIG. 3.

An inorganic insulating film 260 for planarization is provided on the passivation structure 2400 in the active area AA except for the auxiliary connection parts CTS and the transmission parts T.

A connection hole (with reference to CT1 of FIG. 1) configured to expose a part of the drain electrode 234 is formed through the organic insulating film 260, and the first electrode 255 formed, for example, by stacking a first transparent electrode layer 2512, the reflective metal layer 2511 and a second transparent electrode layer 2513, so as to have a greater size than the emission part E, is connected to the drain electrode 234 through the connection hole CT1. Simultaneously with formation of the first electrode 255, pad protective electrodes 257 may be formed on the pad electrodes 238. The pad protective electrodes 257 may be formed of one or two of the metal layers 2512, 2511 and 2513 of the first electrode 255.

The bank 270 configured to open the emission parts E, the transmission parts T and the auxiliary connection parts CTA is provided so as to cover the edge of the first electrode 255.

The organic layer 280 and the second electrode 290 are sequentially provided on the bank 270, the emission parts E and the transmission parts T.

The first electrode 255, the organic layer 280 and the second electrode 290, which are sequentially stacked, form the light emitting device OLED.

The organic layer 280 and the second electrode 290 may be formed using open masks having an opening corresponding to at least the entirety of the active area AA without using fine metal masks having openings corresponding to the respective emission parts. In this case, formation of the organic layer 280 in the region of the undercut UC of the passivation film 2400 is constrained, and the second electrode 290 has relatively excellent step coverage compared to the organic layer 280, and may thus be connected to the auxiliary wiring 230 within the undercut UC. The opening of the open mask used to form the organic layer 280 and the opening of the open mask used to form the second electrode 290 may be different, and the opening of the open mask used to form the second electrode 290 may be greater than the opening of the open mask used to form the organic layer 280 so as to apply voltage to the second electrode 290 from the outside.

The encapsulation layer structure 300 may be formed on the light emitting devices OLED, for example, by sequentially stacking a first inorganic encapsulation layer 310, an organic encapsulation layer 320 and a second inorganic encapsulation layer 330. The encapsulation layer structure 300 may include two inorganic encapsulation layers and one organic encapsulation layer at the minimum, and may include a larger number of encapsulation layers as long as inorganic encapsulation layers and organic encapsulation layers are alternately formed.

In order to prevent penetration of moisture from the outside, the first and second inorganic encapsulation layers 310 and 330 may extend towards the non-active area NA compared to the organic encapsulation layer 320.

On the encapsulation layer structure 300, as shown in FIG. 9, a color filter layer 400 or a touch electrode array may be further provided. In this case, an encapsulation substrate disposed opposite the substrate 200 may be omitted so as to reduce the total thickness of the display device. The color filter layer 400 is formed so as to correspond to at least the emission parts E except for the transmission parts T, and is formed of a pigment which transmits only the wavelengths of a color of light, which a corresponding emission part E desires to display. Different color filter layers 400 may be applied to the emission parts E configured to emit light with different colors.

Hereinafter, a method for manufacturing the display device according to another aspect of the present disclosure will be described.

FIGS. 10A to 10F are longitudinal-sectional views illustrating the method for manufacturing the display device according to another aspect of the present disclosure.

Figure 10A:
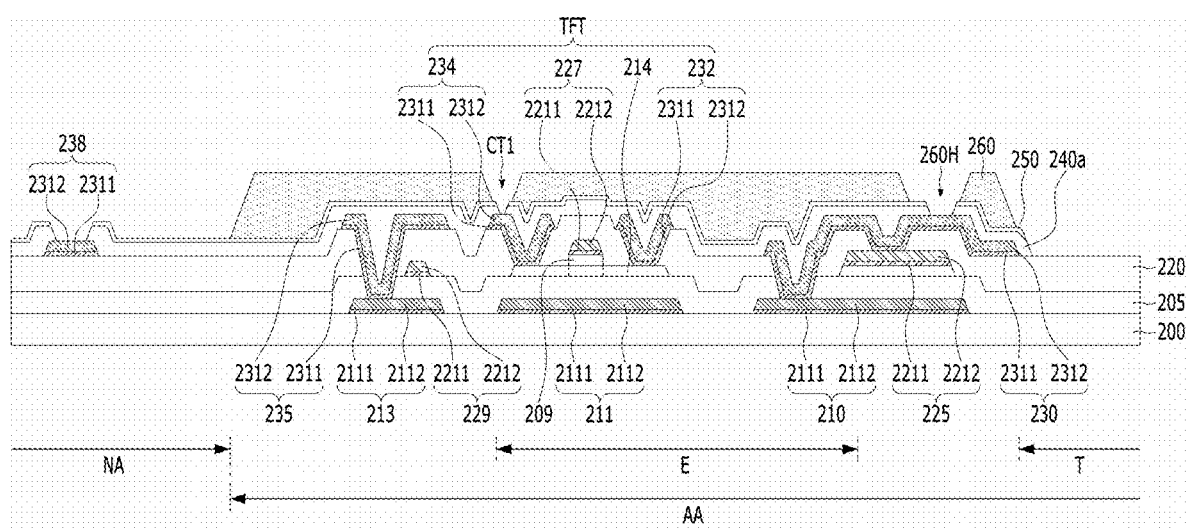
FIGS. 10A to 10F are longitudinal-sectional views illustrating a method for manufacturing the display device according to another aspect of the present disclosure.

As shown in FIG. 10A, the light-shielding layer 211 may be formed on the substrate 200, and in this case, the light-shielding patterns 210 and 213 may be formed in the same layer as the light-shielding layer 211. The buffer layer (not shown) may be formed between the substrate 200 and the light-shielding patterns 210 and 213 and the light-shielding layer 211 so as to prevent impurities of the substrate 200 from penetrating into the thin film transistor array provided thereon.

The light-shielding patterns 210 and 213 and the light-shielding layer 211 may include the first metal layer 2111 and the second metal layer 2112, as shown in these figures. However, the light-shielding patterns 210 and 213 and the light-shielding layer 211 are not limited thereto, and may be formed as a single layer or include a plurality of layers. The first and second metal layers 2111 and 2112 may be formed of a metal having high conductivity, such as aluminum (Al), chromium (Cr), copper (Cu), titanium (Ti), molybdenum (Mo) or tungsten (W), or an alloy including at least one of these metals.

The first interlayer insulating film 205 may be formed so as to cover the light-shielding patterns 210 and 213 and the light-shielding layer 211.

Further, the oxide semiconductor layer 214 may be formed on the first interlayer insulating film 205 so as to overlap the light-shielding layer 211.

The gate electrode 227 is formed to overlap the channel of the semiconductor layer 214 with the gate insulating film 209 interposed therebetween, the second storage electrode 229 may be formed in the same layer as the gate electrode 227 in the storage capacitor region Cst, and the auxiliary connection pattern 225 may be formed in the auxiliary connection part CTA. The auxiliary connection pattern 225 may be omitted. In the same process, gate lines may be formed.

Thereafter, the second interlayer insulating film 220 may be formed so as to cover the gate electrode 227, the second storage electrode 229 and the auxiliary connection pattern 225.

Thereafter, through holes are formed through the first and second interlayer insulating films 205 and 220 so as to expose a part of each of the light-shielding patterns 210 and 213, and connection holes are formed through the second interlayer insulating film 220 so as to expose both sides of the oxide semiconductor layer 214 and a part of the auxiliary connection pattern 225.

The first storage electrode 235 connected to the light-shielding pattern 213 in the storage capacitor region Cst, the source electrode 232 and the drain electrode 234 connected to both sides of the oxide semiconductor layer 214, and the auxiliary wiring 230 having both sides connected to the light-shielding pattern 210 may be formed by stacking the fifth metal layer 2311 and the sixth metal layer 2312 on the second interlayer insulating film 220 so as to fill the respective through holes and connection holes and then selectively removing the fifth and sixth metal layers 2311 and 2312. In the same process, data lines may be formed and the pad electrodes 238 may be formed in the non-active area NA.

Thereafter, after the first layer 240a and the second layer 250 having different ratios of oxygen and nitrogen are sequentially deposited, both the first layer 240a and the second layer 250 are patterned using a mask (not shown) having openings corresponding to a portion of a flat part of the auxiliary wiring 230, a part of the drain electrode 234, the pad electrodes 238 and the transmission parts T. Etching gases or an etchant applied to such patterning have the same reactivity or similar reactivities to the first layer 240a and the second layer 250, and thus, the first layer 240a and the second layer 250 are patterned so as to have open regions having the same width or similar widths, the side parts of the open regions of the first layer 240a and the second layer 250 form a tapered shape but there may be no width difference at the interface between the first layer 240a and the second layer 250.

Here, the transmittance of the transmission parts T may be improved by removing the first layer 240a and the second layer 250 from the transmission parts T.

Thereafter, the organic insulating film 260 may be formed by depositing an organic insulating film material on the upper surface of the second layer 250, and may then be patterned so as to have the first connection part CT1 corresponding to the drain electrode 234 and a hole 260H corresponding to the auxiliary wiring 230 and to be removed from the transmission parts T.

Figure 10B:
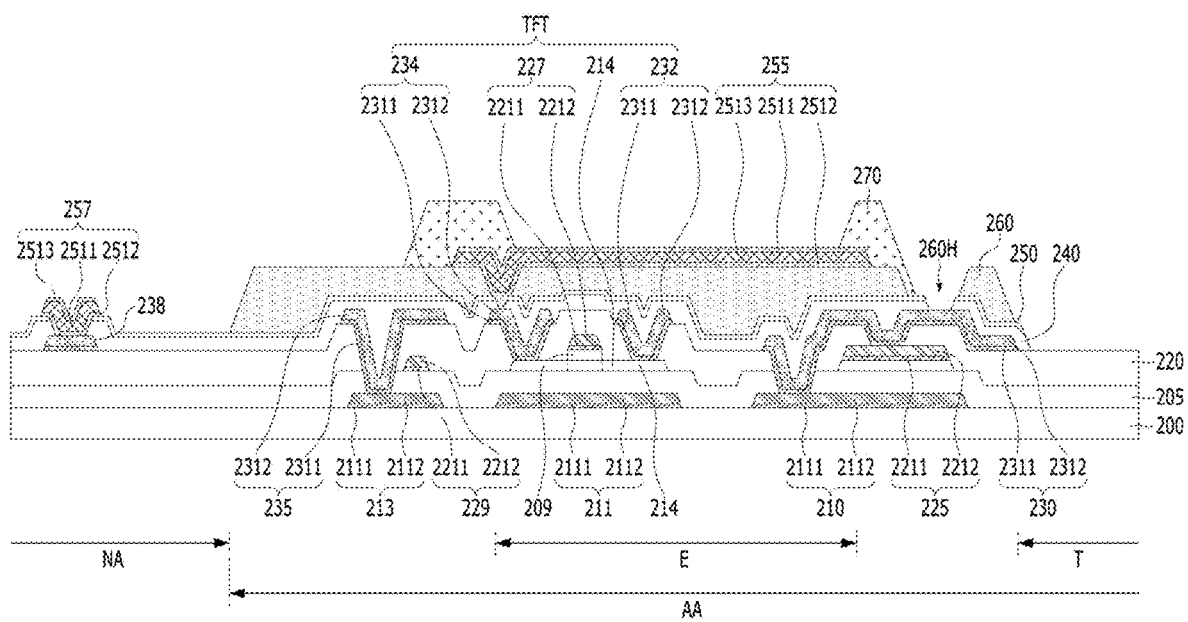

As shown in FIG. 10B, the first electrode 255 is formed by sequentially depositing the first transparent electrode layer 2512, the reflective metal layer 2511 and the second transparent electrode layer 2513 on the organic insulating film 260 and then selectively removing these layers 2512, 2511 and 2513. The first electrode 255 is formed to have a slightly larger size than the emission part E, and thus, upward reflection of light from the emission part E through the first electrode 255 may be effectively performed, and the first electrode 255 may be connected to the drain electrode 234 of the thin film transistor through the first connection part CT1 in the organic insulating film 260 outside the emission part E.

Thereafter, the bank 270 having the holes corresponding to the auxiliary wirings 230, the transmission parts T and the emission parts E is formed by applying a bank material to the surface of the organic insulating film 260 and selectively removing the bank material.

Figure 10C:
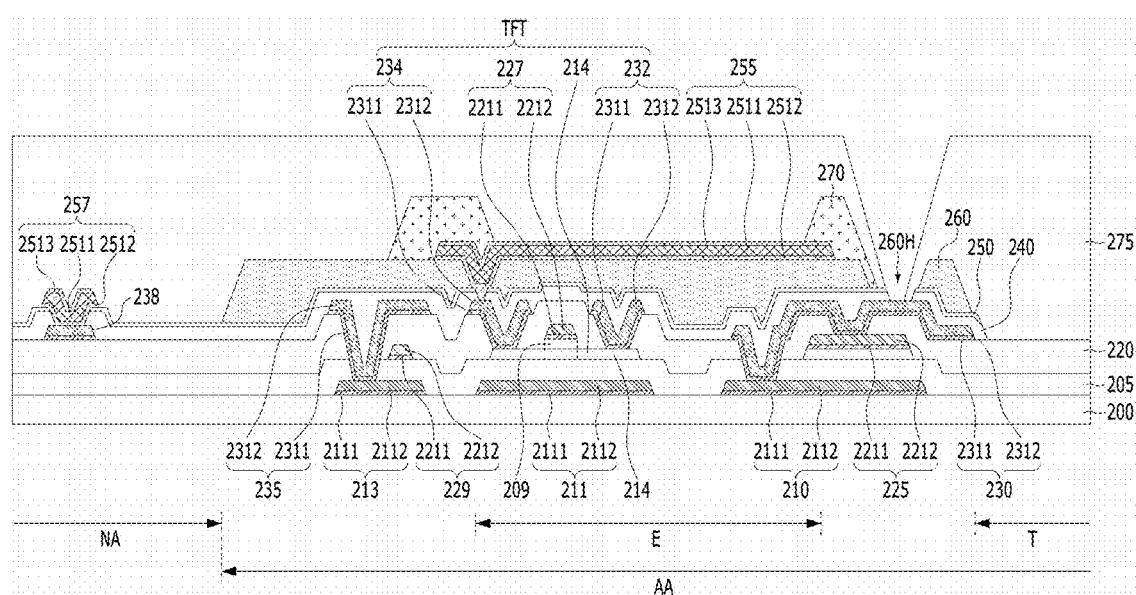

Thereafter, as shown in FIG. 10C, a photoresist pattern 275 is formed so as to expose one side part of the first layer 240 on the auxiliary wiring 230 on the substrate 200 and to cover the other side part of the first layer 240 on the auxiliary wiring 230.

Figure 10D:
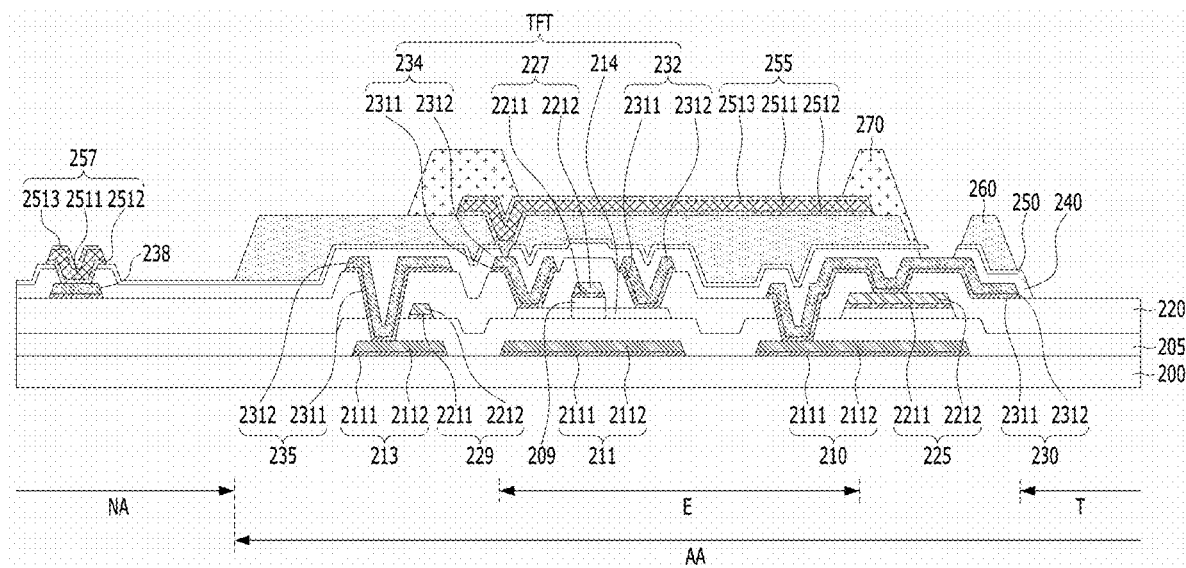

Thereafter, the side part of the first layer 240 exposed from the photoresist pattern 275 is removed compared to the second layer 250, thus forming the undercut UC, as shown in FIG. 10D. Thereafter, the photoresist pattern 275 is removed.

Figure 10E:
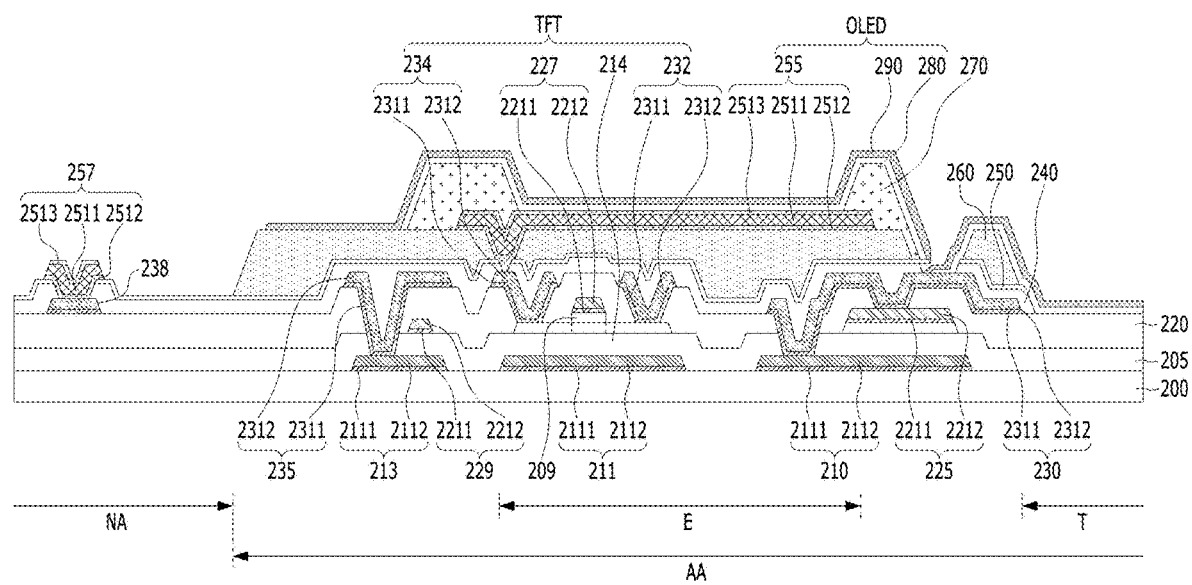
Figure 10F:
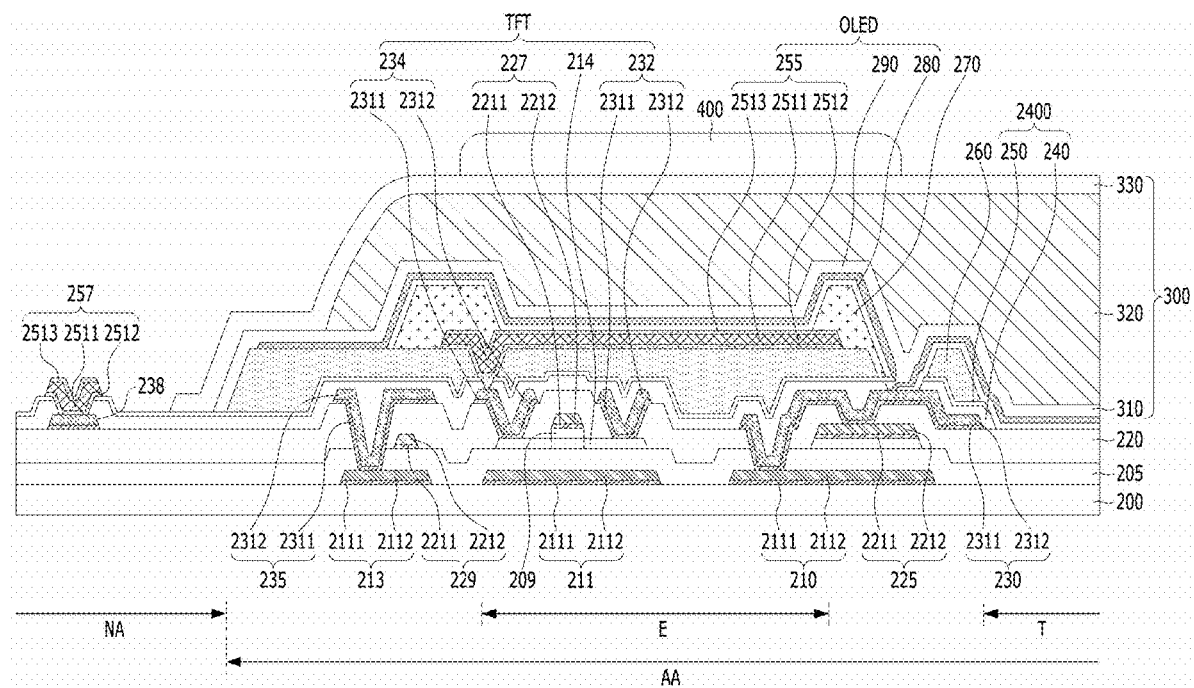

The first layer 240 and the second layer 250 having a width difference between the open regions thereof through the process of FIG. 10D are referred to as the passivation structure (with reference 2400 of FIG. 10F).

Thereafter, as shown in FIG. 10E, the organic layer 280 and the second electrode 290 are formed.

The organic layer 280 may be disconnected at the region of the undercut UC due to the first layer 240 and the second layer 250 having the width difference between the open regions thereof without using a fine metal mask. That is, the second layer 250 on the undercut UC protrudes more than the first layer 140, and serves as a shade when the organic layer 280 is deposited, and may prevent the organic layer 280 from being deposited on the region, in which the first layer 240 is removed, below the second layer 250. The second electrode 290 includes a metal material, such as indium, zinc or titanium, has excellent step coverage compared to the organic layer 280, and may thus be deposited so as to enter into the undercut region. Thereby, after deposition of the second electrode 290, the second electrode 290 may be connected to the auxiliary wiring 230.

The organic layer 280 and the second electrode 290 may be formed using open masks having an opening corresponding to the entirety of the active area AA without using fine metal masks having openings corresponding to the respective emission parts E. In this case, formation of the organic layer 280 in the region of the undercut UC of the passivation film 2400 is constrained, and the second electrode 290 has relatively excellent step coverage compared to the organic layer 280, and may thus be connected to the auxiliary wiring 230 within the undercut UC. The opening of the open mask used to form the organic layer 280 and the opening of the open mask used to form the second electrode 290 may be different, and the opening of the open mask used to form the second electrode 290 may be greater than the opening of the open mask used to form the organic layer 280 so as to apply voltage to the second electrode 290 from the outside.

After formation of the second electrode 290, the capping layer (not shown) may be further formed on the second electrode 290.

The first electrode 255, the organic layer 280 and the second electrode 290 formed in the emission part form the light emitting device OLED.

As shown in FIG. 10F, the encapsulation layer structure 300 is formed by sequentially forming the first inorganic encapsulation layer 310, the organic encapsulation layer 320 and the second inorganic encapsulation layer 330 on the second electrode 290.

The encapsulation layer structure 300 may be formed on the light emitting devices OLED, for example, by sequentially stacking the first inorganic encapsulation layer 310, the organic encapsulation layer 320 and the second inorganic encapsulation layer 330 in order. The encapsulation layer structure 300 may include two inorganic encapsulation layers and one organic encapsulation layer at the minimum, and may include a larger number of encapsulation layers as long as inorganic encapsulation layers and organic encapsulation layers are alternately formed.

In order to prevent penetration of moisture from the outside, the first and second inorganic encapsulation layers 310 and 330 may extend towards the non-active area NA compared to the organic encapsulation layer 320.

The color filter layer 400 or a touch electrode array may be further provided on the encapsulation layer structure 300.

In this case, an encapsulation substrate disposed opposite the substrate 200 may be omitted so as to reduce the total thickness of the display device. The color filter layer 400 is formed so as to correspond to at least the emission parts E except for the transmission parts T, and is formed of a pigment which transmits only the wavelengths of a color of light, which a corresponding emission part E desires to display. Different color filter layers 400 may be applied to the emission parts E configured to emit light with different colors.

As such, in the method for manufacturing the display device according to another aspect of the present disclosure, the passivation structure 2400 protecting the thin film transistors includes a plurality of layers, the undercut structure UC, in which the open region of the first layer 240 of the passivation structure 2400 is greater in size than the open region of the second layer 250, is provided so as to correspond to the auxiliary wiring 230, the organic layer 280 is disconnected in the undercut structure, and thereby, the second electrode 290 may be directly connected to the auxiliary wiring 230, and changes in the characteristics of the thin film transistors may be prevented due to the multilayer passivation structure 2400.

Figure 11:
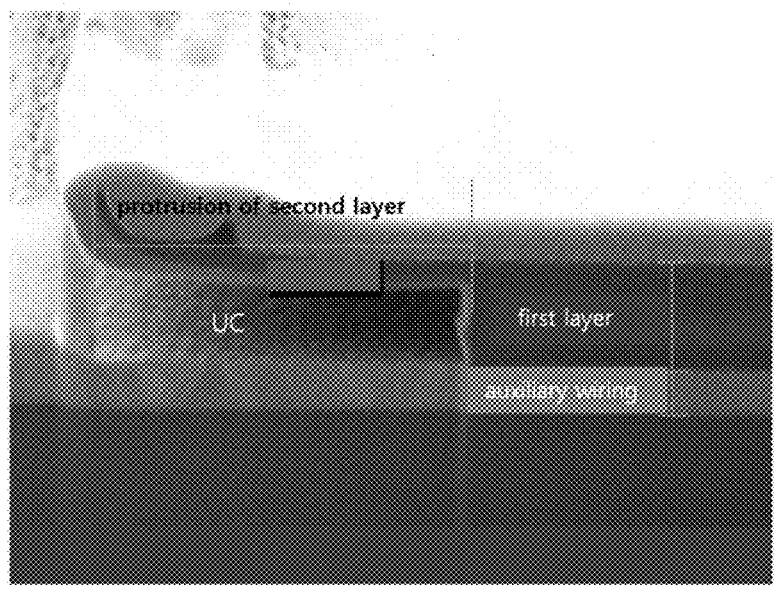
FIG. 11 is an SEM image of an undercut structure according to Test Example 5 (i.e., the undercut structure of the display device) according to the present disclosure.

FIG. 11 is an SEM image of an undercut structure according to Test Example 5, i.e., the undercut structure of the display device according to the present disclosure.

FIG. 11 shows an undercut according to Test Example 5 formed by etching a first layer more than a second layer formed on an auxiliary wiring, like the auxiliary connection parts show in FIGS. 3 and 9. That is, it may be confirmed that, when the first layer and the second layer are formed of different materials and thus etch rates thereof are different, the undercut may be formed in the first layer without collapsing the second layer.

As is apparent from the above description, a display device according to the present disclosure has the following effects.

First, in the display device according to the present disclosure, a passivation structure protecting thin film transistors includes a plurality of layers, an undercut structure, in which the open region of a first layer of the passivation structure is greater in size than the open region of a second layer of the passivation structure, is provided so as to correspond to a part of an auxiliary wiring or an extension of the auxiliary wiring, an organic layer is disconnected at the undercut structure, and thereby, a second electrode, which is subsequently formed, may be directly connected to the auxiliary wiring, and changes in the characteristics of the thin film transistors may be prevented due to the multilayer passivation structure.

Second, the multilayer passivation structure may prevent penetration of hydrogen from the inside of an encapsulation layer structure or diffusion of hydrogen into a thin film transistor array without changing the thickness of a metal layer forming thin film transistors, and thus a process for defining an undercut is applied to the passivation structure without adding a mask, thereby being capable of preventing change in the threshold voltage of the thin film transistors or changes in other characteristics. Therefore, deterioration of yield may be prevented.

Third, in a structure in which emission parts having a small area due to provision of transmission parts use a highly reflective metal in order to increase luminous efficacy, exposure of the highly reflective metal at a connection part with the auxiliary wiring is prevented, thereby being capable of improving reliability of the device while preventing change in the highly reflective metal.

Fourth, when the display device requires slimness and flexibility and a thinned encapsulation layer structure is applied, the multilayer passivation structure formed on the thin film transistor array blocks migration of hydrogen from the encapsulation layer structure formed by a low-temperature process, thereby being capable of minimizing change in the threshold voltage of the thin film transistors and securing stability of light emitting devices over time.

For realizing the above effects, a display device according to one aspect of the disclosure can comprise an auxiliary wiring on a substrate, a passivation structure including a first layer and a second layer stacked on the auxiliary wirings, wherein an open region of the first layer is greater than an open region of the second layer with respect to the auxiliary wiring, a bank on the passivation structure, the bank to have a first hole greater than the open region of the first layer corresponding to the auxiliary wiring, and a second hole corresponding to an emission part and a light emitting device at the emission part, each of the light emitting devices comprising a first electrode comprising a reflective metal layer, an organic layer comprising at least one emission layer, and a second electrode, wherein the second electrode extends towards the auxiliary wiring inside the second hole of the bank and is directly connected to the auxiliary wiring in the open region of the first layer under the second layer.

The first and second layers may be inorganic films, and have different content ratios of oxygen and nitrogen.

One of the first and second layers may be an oxide film, and a remaining one of the first and second layers may be a nitride film.

A thickness of the first layer may be greater than a sum of a thickness of the organic layer and a thickness of the second electrode of the light emitting device.

The open region of the first layer may be greater than the open region of the second layer by a width of 0.4 µm to 2 µm.

The auxiliary wiring may be provided in the same layer as one electrode of a thin film transistor connected to the first electrode of the light emitting device. The passivation structure may cover the thin film transistor.

The thin film transistor may comprise an oxide semiconductor layer, a gate electrode to overlap a part of the oxide semiconductor layer, and a source electrode and a drain electrode connected to both ends of the oxide semiconductor layer. The gate electrode, the source electrode and the drain electrode may comprise a plurality of metal layers, and at least one of the metal layers comprises a metal or a metal alloy capable of collecting hydrogen.

The first electrode may have a stack structure comprising a first transparent conductive layer, the reflective metal layer and a second transparent conductive layer. And the first transparent conductive layer may be bonded to the drain electrode of the thin film transistor by cladding.

The display device according to one aspect of the disclosure may further comprise a light-shielding layer under the oxide semiconductor layer and comprising a metal layer capable of collecting hydrogen. At least one connection pattern connected to the auxiliary wiring may be further provided in the same layer as the light-shielding layer.

The display device according to one aspect of the disclosure may further comprise an encapsulation layer structure to cover the light emitting devices. The encapsulation layer structure may comprise at least one organic layer and inorganic layers to contact upper and lower surfaces of the at least one organic layer. And among the inorganic layers of the encapsulation layer structure, a lowermost inorganic layer may enter into the first holes.

Among the first and second layers, a layer corresponding to a nitride film may have a higher density than a density of the lowermost inorganic layer of the encapsulation layer structure.

The display device according to one aspect of the disclosure may further comprise an organic insulating layer between the passivation structure and the bank. The bank may further comprise a third hole. The organic insulating layer and the passivation structure under the bank may have a removal part corresponding to the third hole.

The display device according to another aspect of the disclosure may comprise a substrate having an emission part, a transmission part and an auxiliary connection part, an auxiliary wiring at the auxiliary connection parts of the substrate, a passivation structure including a first layer and a second layer stacked on the auxiliary wiring, the bank to have a first hole greater than the open region of the first layer corresponding to the auxiliary wiring, a second hole corresponding to the emission part, and a third hole corresponding to the transmission part, and a light emitting device at the emission parts, the light emitting devices comprising a first electrode comprising a reflective metal layer, an organic layer comprising at least one emission layer, and a second electrode.

An open region of the first layer may be greater than an open region of the second layer with respect to the auxiliary wiring, a bank on the passivation structure. And the second electrode may extend towards the auxiliary wiring in the open region of the first layer under the second layer.

The first and second layers may be inorganic films, and may have different content ratios of oxygen and nitrogen.

A thickness of the first layer may be greater than a sum of a thickness of the organic layer and a thickness of the second electrode of each of light emitting devices.

The display device according to another aspect of the disclosure may further comprise an encapsulation layer structure configured to cover the light emitting device. The encapsulation layer structure may comprise at least one organic layer and inorganic layers to contact upper and lower surfaces of the at least one organic layer. And among the inorganic layers of the encapsulation layer structure, a lowermost inorganic layer may enter into the first hole.

The first layer and the second layer of the passivation structure may have higher densities than a density of the lowermost inorganic layer of the encapsulation layer structure.

The passivation structure may cover a thin film transistor. The thin film transistor may comprise an oxide semiconductor layer, a gate electrode to overlap a part of the oxide semiconductor layer, and a source electrode and a drain electrode connected to both ends of the oxide semiconductor layer. The gate electrode, the source electrode and the drain electrode may comprise a plurality of metal layers, respectively. And at least one of the metal layers may comprise a metal or a metal alloy capable of collecting hydrogen. The auxiliary wiring may be connected to the source electrode and the drain electrode.

At least one layer of the passivation structure may be removed from the transmission part.

The first electrode may have a stack structure comprising a first transparent conductive layer, the reflective metal layer and a second transparent conductive layer, and the first transparent conductive layer may be cladded to the drain electrode of the thin film transistor.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device comprising:
   an auxiliary wiring disposed on a substrate;
   a passivation structure including a first layer and a second layer stacked on the auxiliary wirings, wherein the first and second layer has open regions corresponding to the auxiliary wiring, and the open region of the first layer is greater than the open region of the second layer;
   a bank disposed on the passivation structure and having first and second holes, the second hole overlapping with an emission part, wherein the first hole is greater than the open region of the first layer;
   an organic insulating layer between the passivation structure and the bank to cover steps of the passivation structure; and
   a light emitting device disposed at the emission part, each of the light emitting devices comprising a first electrode comprising a reflective metal layer, an organic layer comprising at least one emission layer, and a second electrode,
   wherein the second electrode extends towards the auxiliary wiring inside the first hole of the bank, and is electrically connected to the auxiliary wiring in the open region of the first layer under the second layer,
   wherein the bank further comprises a third hole, and
   wherein the organic insulating layer and the passivation structure under the bank have a removal part corresponding to the third hole.

2. The display device according to claim 1, wherein the first and second layers include inorganic films and have different ratios in oxygen and nitrogen.

3. The display device according to claim 1, wherein one of the first and second layers is an oxide film and another one of the first and second layers is a nitride film.

4. The display device according to claim 1, wherein a thickness of the first layer is greater than a sum of a thickness of the organic layer and a thickness of the second electrode of the light emitting device.

5. The display device according to claim 1, wherein the open region of the first layer is greater than the open region of the second layer by a width of 0.4 µm to 2 µm.

6. The display device according to claim 1, wherein the auxiliary wiring is provided in a same layer as one electrode of a thin film transistor connected to the first electrode of the light emitting device; and
   wherein the passivation structure covers the thin film transistor.

7. The display device according to claim 6, wherein the thin film transistor comprises an oxide semiconductor layer, a gate electrode to overlap a part of the oxide semiconductor layer, and a source electrode and a drain electrode connected to both ends of the oxide semiconductor layer, and
   wherein the gate electrode, the source electrode and the drain electrode comprise a plurality of metal layers, and at least one of the metal layers comprises a metal or a metal alloy capable of collecting hydrogen.

8. The display device according to claim 7, wherein the first electrode has a stack structure comprising a first transparent conductive layer, the reflective metal layer and a second transparent conductive layer, and the first transparent conductive layer is bonded to the drain electrode of the thin film transistor by cladding.

9. The display device according to claim 7, further comprising a light-shielding layer under the oxide semiconductor layer and comprising a metal layer capable of collecting hydrogen,
wherein at least one connection pattern connected to the auxiliary wiring is further provided in the same layer as the light-shielding layer.

10. The display device according to claim 1, further comprising an encapsulation layer structure to cover the light emitting devices,
wherein the encapsulation layer structure comprises at least one organic layer and inorganic layers to contact upper and lower surfaces of the at least one organic layer, and among the inorganic layers of the encapsulation layer structure, a lowermost inorganic layer enters into the first holes.

11. The display device according to claim 10, wherein, among the first and second layers, a layer corresponding to a nitride film has a higher density than a density of the lowermost inorganic layer of the encapsulation layer structure.

12. A display device comprising:
a substrate having an emission part, a transmission part and an auxiliary connection part;
an auxiliary wiring at the auxiliary connection parts of the substrate;
a passivation structure including a first layer and a second layer stacked on the auxiliary wiring, wherein an open region of the first layer is greater than an open region of the second layer with respect to the auxiliary wiring;
a bank disposed on the passivation structure and having a first hole greater than the open region of the first layer corresponding to the auxiliary wiring, a second hole corresponding to the emission part, and a third hole corresponding to the transmission part; and
a light emitting device disposed at the emission parts, the light emitting devices comprising a first electrode comprising a reflective metal layer, an organic layer comprising at least one emission layer, and a second electrode,
wherein the second electrode extends towards the auxiliary wiring, and contacts the auxiliary wiring in the open region of the first layer under the second layer.

13. The display device according to claim 12, wherein the first and second layers are inorganic films, and have different ratios in oxygen and nitrogen.

14. The display device according to claim 12, wherein a thickness of the first layer is greater than a sum of a thickness of the organic layer and a thickness of the second electrode of each of light emitting devices.

15. The display device according to claim 13, further comprising an encapsulation layer structure configured to cover the light emitting device,
wherein the encapsulation layer structure comprises at least one organic layer and inorganic layers to contact upper and lower surfaces of the at least one organic layer, and among the inorganic layers of the encapsulation layer structure, a lowermost inorganic layer enters into the first hole.

16. The display device according to claim 15, wherein the first layer and the second layer of the passivation structure have higher densities than a density of the lowermost inorganic layer of the encapsulation layer structure.

17. The display device according to claim 12, wherein the passivation structure covers a thin film transistor that comprises an oxide semiconductor layer, a gate electrode to overlap with a part of the oxide semiconductor layer, and a source electrode and a drain electrode connected to both ends of the oxide semiconductor layer,
wherein the gate electrode, the source electrode and the drain electrode comprise a plurality of metal layers, respectively, and at least one of the metal layers comprises a metal or a metal alloy capable of collecting hydrogen; and
wherein the auxiliary wiring is connected to the source electrode and the drain electrode.

18. The display device according to claim 17, wherein the first electrode has a stack structure comprising a first transparent conductive layer, the reflective metal layer and a second transparent conductive layer, and the first transparent conductive layer is cladded to the drain electrode of the thin film transistor.

19. The display device according to claim 12, wherein at least one layer of the passivation structure is removed from the transmission part.

* * * * *